US012660430B2

(12) United States Patent
Lee et al.

(10) Patent No.: US 12,660,430 B2
(45) Date of Patent: Jun. 16, 2026

(54) DISPLAY DEVICE

(71) Applicant: Samsung Display Co., LTD., Yongin-si (KR)

(72) Inventors: Pil Suk Lee, Yongin-si (KR); Yoo Min Ko, Yongin-si (KR); Sun Ho Kim, Yongin-si (KR); Hye Won Kim, Yongin-si (KR); Ju Chan Park, Yongin-si (KR); Chung Sock Choi, Yongin-si (KR); Sung Jin Hong, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 456 days.

(21) Appl. No.: 18/469,637

(22) Filed: Sep. 19, 2023

(65) Prior Publication Data

US 2024/0099075 A1     Mar. 21, 2024

(30) Foreign Application Priority Data

Sep. 20, 2022    (KR) ........................ 10-2022-0118640

(51) Int. Cl.
*H10K 59/123*        (2023.01)
*H10K 59/122*        (2023.01)

(52) U.S. Cl.
CPC ......... *H10K 59/123* (2023.02); *H10K 59/122* (2023.02)

(58) Field of Classification Search
CPC .. H10K 59/123; H10K 59/122; H10K 59/131; H10K 59/1315; H10K 50/822; H10K 50/8426; H10K 50/844
See application file for complete search history.

(56) References Cited

U.S. PATENT DOCUMENTS

| 10,651,250 | B2 * | 5/2020 | Chen ..................... H10K 59/124 |
| 11,183,547 | B2 * | 11/2021 | Baek .................. H10K 59/1213 |
| 11,978,828 | B2 * | 5/2024 | So ............................ H01Q 1/22 |
| 2017/0025488 | A1 * | 1/2017 | Li ......................... H10K 59/126 |
| 2017/0345882 | A1 * | 11/2017 | Nam ..................... H10K 71/166 |

(Continued)

FOREIGN PATENT DOCUMENTS

| CN | 103280539 | 9/2013 |
| EP | 3128557 B1 * | 4/2022 | ............. H10K 59/87 |

(Continued)

*Primary Examiner* — Mamadou L Diallo
(74) *Attorney, Agent, or Firm* — Innovation Counsel LLP

(57) ABSTRACT

A display device includes: a substrate; a transistor disposed on the substrate; a first electrode disposed on the substrate; a pixel definition layer disposed on the first electrode; a separator pattern layer disposed on the pixel definition layer; a second electrode disposed on the first electrode, the pixel definition layer, and the separator pattern layer; a connection layer connected between the transistor and the second electrode; an emission layer disposed between the first electrode and the second electrode; a conductive pattern layer; and a capping member covering a side end portion of the conductive pattern layer, wherein the conductive pattern layer and the connection layer are disposed on a same layer, and a part of the second electrode disposed on the separator pattern layer and a part of the second electrode disposed around the separator pattern layer are separated from each other.

21 Claims, 18 Drawing Sheets

(56)           References Cited

U.S. PATENT DOCUMENTS

| | | | |
|---|---|---|---|
| 2021/0159289 A1 | 5/2021 | Liu | |
| 2022/0190285 A1* | 6/2022 | Huang | H10K 50/844 |
| 2023/0035664 A1* | 2/2023 | An | H10D 86/411 |
| 2023/0209910 A1* | 6/2023 | Park | H10K 59/8723 |
| | | | 257/40 |
| 2024/0016032 A1 | 1/2024 | Choi et al. | |
| 2025/0359454 A1* | 11/2025 | Liu | H10K 59/352 |

FOREIGN PATENT DOCUMENTS

| | | | |
|---|---|---|---|
| KR | 10-1040816 | 6/2011 | |
| KR | 10-2021-0081941 | 7/2021 | |
| KR | 10-2021-0086059 | 7/2021 | |
| KR | 20220100761 A * | 7/2022 | H10K 59/873 |
| KR | 10-2024-0007973 | 1/2024 | |

* cited by examiner

DISPLAY DEVICE

CROSS-REFERENCE TO RELATED APPLICATION(S)

This application claims priority to and benefits of Korean Patent Application No. 10-2022-0118640 under 35 U.S.C. § 119, filed on Sep. 20, 2022, in the Korean Intellectual Property Office, the entire contents of which are incorporated herein by reference.

BACKGROUND

1. Technical Field

Embodiments relate to a display device.

2. Description of the Related Art

A display device is a device for displaying an image, and includes a liquid crystal display device, an organic light emitting diode (OLED) display device, and the like. The display device is used in various electronic devices such as a mobile phone, a navigation device, a digital camera, an electronic book, a portable game machine, and various terminals.

The organic light emitting diode (OLED) display device includes electrodes and an organic emission layer between the electrodes. Electrons injected from an electrode and holes injected from another electrode are recombined in the organic emission layer to generate excitons. The generated excitons are changed to a ground state from an exited state, releasing energy to emit light.

The display device may include pixels, and each pixel may include a light-emitting element and a pixel driving circuit unit connected to each other. The pixel driving circuit unit may include an n-type (or NMOS) transistor and/or a p-type (or PMOS) transistor. In case that the pixel driving circuit unit is formed of an n-type transistor, as a source voltage of a driving transistor is shifted by a degradation of the light-emitting element, an afterimage may be generated or luminance deterioration may be accelerated, and thus the display device may be degraded.

The above information disclosed in this Background section is only for enhancement of understanding of the background of the described technology, and therefore it may contain information that does not form the prior art that is already known in this country to a person of ordinary skill in the art.

SUMMARY

Embodiments provide a display device capable of improving display quality.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a substrate; a transistor disposed on the substrate; a first electrode disposed on the substrate; a pixel definition layer disposed on the first electrode; a separator pattern layer disposed on the pixel definition layer; a second electrode disposed on the first electrode, the pixel definition layer, and the separator pattern layer; a connection layer connected between the transistor and the second electrode; an emission layer disposed between the first electrode and the second electrode; a conductive pattern layer; and a capping member covering a side end portion of the conductive pattern layer, wherein the conductive pattern layer and the connection layer may be disposed on the same layer, and a part of the second electrode disposed on the separator pattern layer and a part of the second electrode disposed around the separator pattern layer may be separated from each other.

The display device may include: a display area that displays an image; and a peripheral area surrounding the display area, and the conductive pattern layer and the capping member may be disposed in the peripheral area.

The conductive pattern layer may be configured to transmit a substantially constant voltage, and may have a planar shape surrounding the display area.

The conductive pattern layer may be connected to the first electrode and may be configured to transmit a high potential power voltage.

The display device may further include: an opposing substrate facing the substrate; and an encapsulation member disposed between the substrate and the opposing substrate, and the encapsulation member may overlap the side end portion of the conductive pattern layer.

Each of the connection layer and the conductive pattern layer may be formed of a triple layer including a lower layer, an upper layer, and a middle layer between the lower layer and the upper layer, and at a side end portion of the connection layer, the lower layer and the upper layer of the connection layer may protrude more than the middle layer of the connection layer. At the side end portion of the conductive pattern layer, the lower layer, the middle layer, and the upper layer of the conductive pattern layer may be aligned with each other.

The lower layer and the upper layer of each of the connection layer and the conductive pattern layer may include titanium, and the middle layer of each of the connection layer and the conductive pattern layer may include aluminum.

The display device may further include an organic insulating layer covering another side end portion of the connection layer and another side end portion of the conductive pattern layer, and the side end portion of the connection layer and the side end portion of the conductive pattern layer may not be covered by the organic insulating layer.

The capping member may cover a side surface and a top surface of the side end portion of the conductive pattern layer.

The capping member may have a rod shape extending along the conductive pattern layer in a plan view.

The capping member may have a net shape including a first portion extending along the conductive pattern layer and a second portion extending to cross the first portion in a plan view.

The capping member may entirely overlap the conductive pattern layer.

The display device may further include a pad portion disposed in the peripheral area and including the conductive pattern layer.

The pad portion may include a plurality of conductive pattern layers, and the plurality of conductive pattern layers may be spaced apart from each other.

Each of the connection layer and the conductive pattern layer may be formed of a triple layer including a lower layer, an upper layer, and a middle layer between the lower layer and the upper layer, at a side end portion of the connection layer, the lower layer and the upper layer of the connection layer may protrude more than the middle layer of the connection layer, and at the side end portion of the conductive pattern layer, the lower layer, the middle layer, and the upper layer of the conductive pattern layer may be aligned with each other.

The display device may further include an organic insulating layer covering another side end portion of the connection layer, and the conductive pattern layer may not be covered by the organic insulating layer.

The capping member may cover a side surface and a top surface of the side end portion of the conductive pattern layer.

The capping member may overlap opposite edge portions of the conductive pattern layer.

The capping member may entirely overlap edge portions of the conductive pattern layer.

The capping member may entirely overlap the conductive pattern layer.

The capping member may include a conductive material.

According to embodiments, it is possible to improve display quality of the display device.

DETAILED DESCRIPTION OF THE EMBODIMENTS

Figure 1:
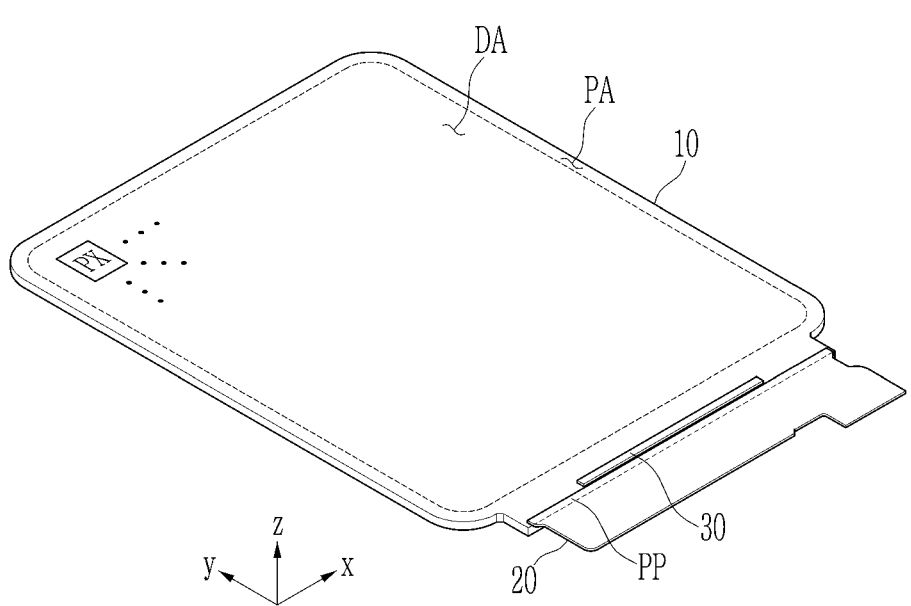
FIG. 1 is a schematic perspective view schematically showing a display device according to an embodiment.

In the following description, for the purposes of explanation, numerous specific details are set forth in order to provide a thorough understanding of various embodiments or implementations of the invention. As used herein, "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element or a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the axis of the first direction x, the axis of the second direction y, and the axis of the third direction z are not limited to three axes of a rectangular coordinate system, such as the X, Y, and Z-axes, and may be interpreted in a broader sense. For example, the axis of the first direction x, the axis of the second direction y, and the axis of the third direction z may be perpendicular to one another, or may represent different directions that are not perpendicular to one another. For the purposes of this disclosure, "at least one of A and B" may be understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, a display device according to an embodiment will be described with reference to accompanying drawings.

FIG. 1 is a schematic perspective view schematically showing a display device according to an embodiment.

As shown in FIG. 1, a display device according to an embodiment may include a display panel 10, a flexible printed circuit unit 20 bonded to the display panel 10, a driving device including an integrated circuit (IC) chip 30, and the like. The display device may be used to display images in electronic devices such as mobile phones, smart phones, tablets, laptop computers, monitors, multimedia players, and game machines.

The display panel 10 may include a display area DA corresponding to a screen on which an image is displayed, and a peripheral area PA in which circuits and/or wirings for generating and/or transmitting various signals applied to the display area DA are disposed. The peripheral area PA may surround the display area DA. In FIG. 1, the inside of the closed loop made of the dotted line may be the display area DA, and the outside of the closed loop may be the peripheral area PA. The display area DA may be approximately quadrangular on a plane. For example, the corner portion of the display area DA may have a rounded shape. However, the shape of the display area DA is only an example and may be variously changed. For example, the display area DA may have various shapes other than quadrangular shape, such as other polygonal shape, circular shape, and oval shape.

In the display area DA of the display panel 10, the pixels PX may be disposed in a matrix form. For example, wirings such as a gate line, a data line, and a power voltage line may be disposed in the display area DA. The gate line may extend approximately in the first direction x, the data line may extend approximately in the second direction y, and the power voltage line may extend approximately in the first direction x and/or the second direction y. However, the arrangements (or structures) of these pixels PX and wirings are an example and may be variously changed. The gate line, the data line, the power voltage line, etc. may be connected to each pixel PX, and each pixel PX may receive a gate signal (also called a scan signal), a data voltage, and a power voltage from these wirings. Each pixel PX may include a light-emitting element and a pixel driving circuit unit connected thereto. The pixel driving circuit unit may be connected to one terminal of the light-emitting element and may be a unit circuit part composed of elements including a driving transistor, and may generate a driving current based on signals applied through wirings such as the gate lines and the data lines, and may apply the generated driving current to light-emitting elements.

For example, a touch sensor for detecting a user's contact and/or non-contact touch may be disposed in the display area DA.

In the peripheral area PA of the display panel 10, a pad portion PP, in which pad electrodes for receiving signals from the outside of the display panel 10 are arranged, may be positioned. The pad portion PP may extend in the first direction x along an edge portion of the display panel 10. For example, pad electrodes may be spaced apart from each other at a certain interval (or distance) along the first direction x. The flexible printed circuit unit 20 may be bonded to the pad portion PP, and the pads of the flexible printed circuit unit 20 may be connected (e.g., electrically connected) to the pad electrodes of the pad portion PP.

A driving unit that generates and/or processes various signals for driving the display panel 10 may be positioned in the peripheral area PA of the display panel 10. The driving unit may include a data driver that applies a data voltage to the data lines, a gate driver that applies a gate signal to the gate lines, and a timing controller that controls the data driver and the gate driver. The pixels PX may receive a data voltage at certain timing according to a gate signal generated by the gate driver. The gate driver may be integrated in the display panel 10 and may be positioned on at least one side of the display area DA. The data driver and the timing controller may be provided as an integrated circuit chip (also referred to as a driving IC chip or a driving IC) 30, and the integrated circuit chip 30 may be mounted in the peripheral area PA of the display panel 10. The integrated circuit chip 30 may be mounted on the flexible printed circuit unit 20 or the like and electrically connected to the display panel 10.

Figure 2:
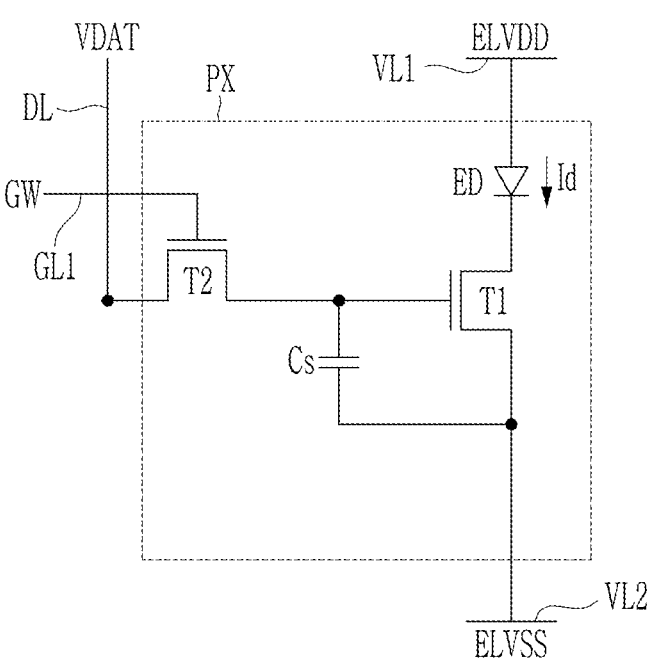
FIG. 2 is a schematic diagram of an equivalent circuit of a representative pixel of a display device according to an embodiment.
Figure 3:
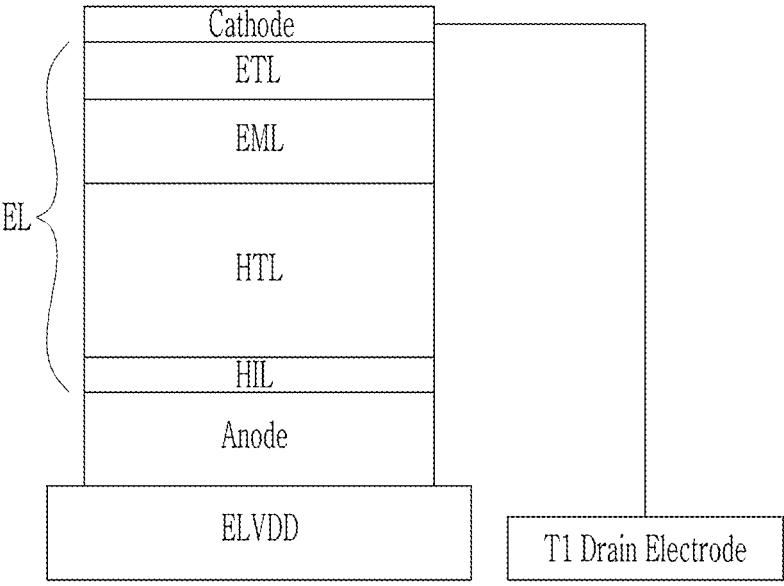
FIG. 3 is a schematic view schematically showing a stacked structure of a light-emitting element of a display device according to an embodiment.

FIG. 2 is a schematic diagram of an equivalent circuit of a representative pixel of a display device according to an embodiment, and FIG. 3 is a schematic view schematically showing a stacked structure of a light-emitting element of a display device according to an embodiment.

Referring to FIG. 2, the display device according to an embodiment may include pixels PX, and each of pixels PX may include a light-emitting element ED and a pixel driving circuit unit connected thereto. The pixel driving circuit unit may include transistors T1 and T2 and a first capacitor Cs. The light-emitting element ED may be an organic light emitting diode or an inorganic light emitting diode, but embodiments are not limited thereto. Several wirings GL1, DL, VL1, and VL2 may be connected to the pixel driving circuit unit. Although the structure of a representative pixel PX including two transistors T1 and T2 and one capacitor Cs is illustrated in FIG. 2, embodiments are not limited thereto, and the number of the transistors and capacitors may be variously changed. Although the structure in which four wirings GL1, DL, VL1, and VL2 are connected to one pixel PX is illustrated in FIG. 2, embodiments are not limited thereto, and the type and number of the wirings may be variously changed.

The wirings GL1, DL, VL1, and VL2 may include a scan line GL1, a data line DL, a first power voltage line VL1, and a second power voltage line VL2. The scan line GL1 may be connected (e.g., electrically connected) to the gate driver. The data line DL may be connected (e.g., electrically connected) to the data driver. The first power voltage line VL1 and the second power voltage line VL2 may be connected to a voltage generator. The scan line GL1 may transmit the scan signal GW to the second transistor T2. The data line DL may transmit a data voltage VDAT. The first power voltage line VL1 (also referred to as a high potential voltage line) may transmit a first power voltage ELVDD (also referred to as a high potential power voltage). The second power voltage line VL2 (also referred to as a low potential voltage line) may transmit a second power voltage ELVSS (also referred to as a low potential power voltage).

The transistors T1 and T2 may include a first transistor T1 that is a driving transistor and a second transistor T2 that is a switching transistor. Each of the transistors T1 and T2 may include a gate electrode, a source electrode, and a drain electrode. The transistors T1 and T2 may be n-type transistors, but at least one of the transistors T1 and T2 may be a p-type transistor.

The gate electrode of the first transistor T1 may be connected to the first capacitor electrode of the first capacitor Cs and one electrode of the second transistor T2, the source electrode of the first transistor T1 may be connected to the second capacitor electrode of the first capacitor Cs, and the drain electrode of the first transistor T1 may be connected to a cathode of the light-emitting element ED. The first transistor T1 may control a driving current Id flowing through the light-emitting element ED according to the magnitude of the data voltage VDAT transmitted through the second transistor T2, and the light-emitting element ED may emit light with a luminance that varies according to the magnitude of the driving current Id. Therefore, each pixel PX may display a gray by adjusting the amount of the current flowing through the first transistor T1 according to the magnitude of the data voltage VDAT.

The gate electrode of the second transistor T2 may be connected to the scan line GL1, another electrode of the second transistor T2 may be connected to the data line DL, and the one electrode of the second transistor T2 may be connected to the gate electrode of the first transistor T1 and the first capacitor electrode of the first capacitor Cs. The second transistor T2 may be turned on according to the scan signal GW transmitted through the scan line GL1, thereby performing a switching operation in which the data voltage VDAT transmitted through the data line DL is transmitted to the gate electrode of the first transistor T1 and the first capacitor electrode of the first capacitor Cs.

The first capacitor electrode of the first capacitor Cs may be connected to the gate electrode of the first transistor T1 and the one electrode of the second transistor T2, and the second capacitor electrode of the first capacitor Cs may be connected to the source electrode of the first transistor T1. The first capacitor Cs may continuously apply the stored data voltage VDAT to the first transistor T1, so that the light-emitting element ED continuously emits light during the light emission period.

The anode of the light-emitting element ED may be connected to the first power voltage line VL1, and the cathode of the light-emitting element ED may be connected to the drain electrode of the first transistor T1. The first transistor T1 may be the n-type transistor, and the first power voltage line VL1 and the second power voltage line VL2 may apply the first power voltage ELVDD and the second power voltage ELVSS, respectively. Thus, the terminal of the first transistor T1 connected to the cathode of the light-emitting element ED may be a drain electrode.

Referring to FIG. 3, the light-emitting element ED may include the anode to which the first power voltage ELVDD is applied, the cathode connected (e.g., electrically connected) to the drain electrode of the first transistor T1, and a middle layer EL positioned between the anode and the cathode. The middle layer EL may include an emission layer EML and a functional layer. The emission layer EML may be a layer in which electro-optical conversion is made through a recombination of electrons and holes, and may include organic materials and/or inorganic materials that emit light of a certain color. The functional layer may include at least one of a hole injection layer HIL, a hole transport layer HTL, an electron transport layer ETL, and an electron injection layer. In FIG. 3, as the functional layer, the hole injection layer HIL and the hole transport layer HTL positioned between the anode and the emission layer EML, and the electron transport layer ETL positioned between the emission layer EML and the cathode, are shown.

Since the pixel driving circuit unit is composed of the n-type transistors T1 and T2, in case that the anode of the light-emitting element ED is connected to the source electrode of the first transistor T1, as the source voltage of the first transistor T1 is shifted due to degradation of the light-emitting element ED, the gate-source voltage (Vgs) of the first transistor T1 may be changed so that the range of the change of the driving current Id may increase, which makes it vulnerable to afterimages, and a luminance deterioration may be accelerated. As in an embodiment, as the pixel driving circuit unit is configured so that the cathode of the light-emitting element ED may be connected to the drain electrode of the first transistor T1, in case that the light-emitting element ED is degraded, the gate-source voltage (Vgs) of the first transistor T1 may not be changed, and accordingly, the change range of the driving current Id may be reduced, which is advantageous in preventing the afterimages and the luminance deterioration.

In order to connect the cathode of the light-emitting element ED to the drain electrode of the first transistor T1, the light-emitting element, in which the cathode is positioned at the bottom and the anode is positioned at the top, may be configured. However, this type of light-emitting element may have disadvantageous limitations in the driving voltage, the luminous efficiency, and the like, compared to a light-emitting element in which the anode is positioned at the bottom and the cathode is positioned at the top. To improve this, the light-emitting element ED according to the embodiment may have a structure in which the anode is positioned at the bottom, the cathode is positioned at the top, and the cathode is connected to the drain electrode of the first transistor T1.

Hereinafter, the structure of the pixel positioned in the display area of the display device according to an embodiment is described with reference to FIG. 4.

Figure 4:
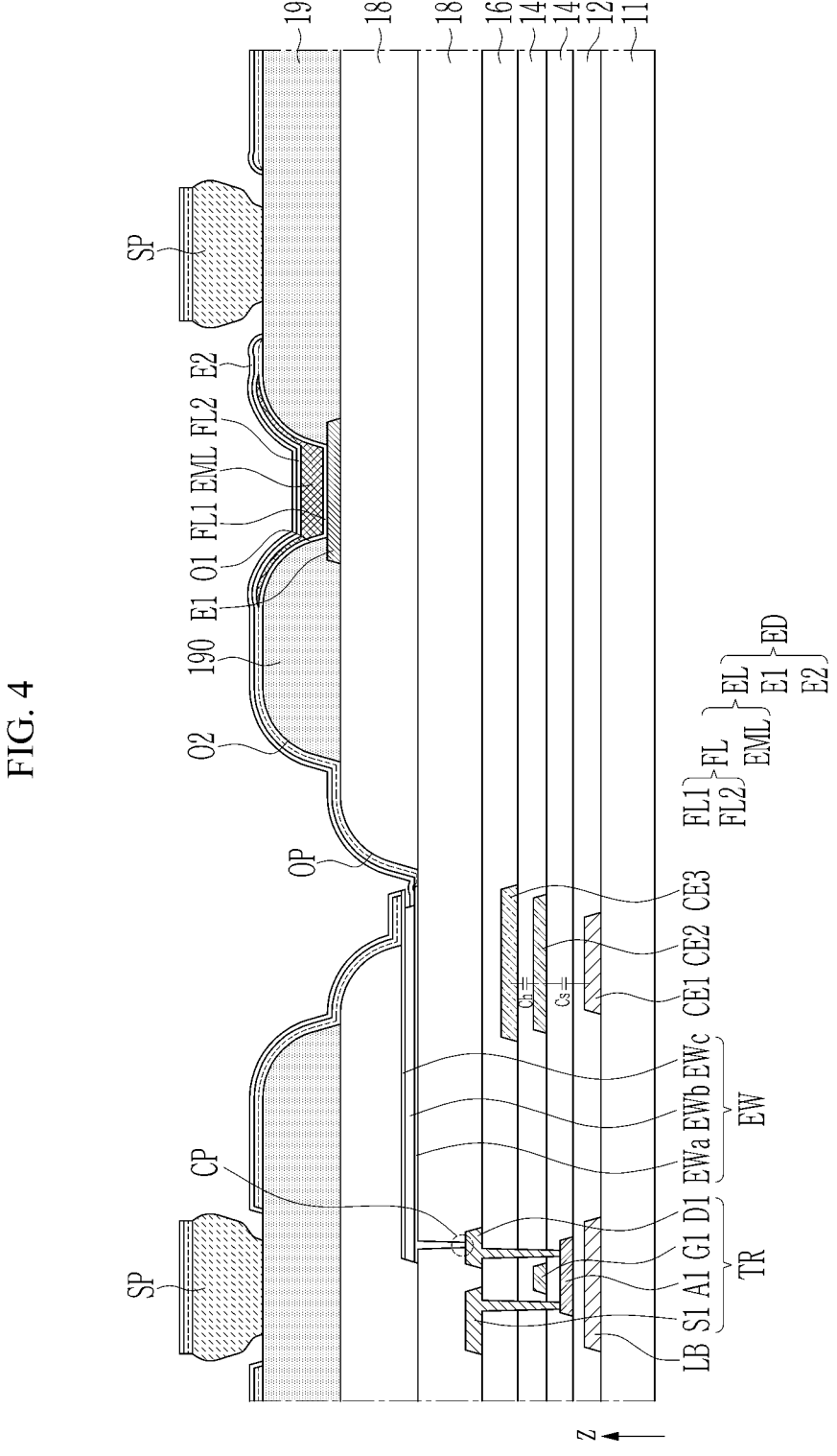
FIG. 4 is a schematic cross-sectional view showing a display device according to an embodiment.

FIG. 4 is a schematic cross-sectional view showing a display device according to an embodiment. FIG. 4 shows the pixel positioned in the display area of the display device according to an embodiment.

As shown in FIG. 4, the display device according to an embodiment may include a substrate 110, a transistor TR positioned on the substrate 110, and a light-emitting element ED connected to the transistor TR. The transistor TR may be one of transistors included in the pixel driving circuit unit.

The substrate 110 may be a rigid substrate or a flexible substrate capable of bending, folding, or rolling. For example, the substrate 110 may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. The substrate 110 may be single-layered or multi-layered. The substrate 110 may have a structure in which at least one base layer and at least one inorganic layer, including a polymer resin sequentially stacked, are alternately stacked.

A first conductive layer that includes a light blocking layer LB, a first capacitor electrode CE1, etc. may be positioned on the substrate 110. The light blocking layer LB prevents external light from reaching the semiconductor layer A1, e.g., the channel region of the semiconductor layer A1, which will be described below, thereby preventing characteristic deterioration of the semiconductor layer A1 and controlling a leakage current of the transistor TR. The constituent elements included in the first conductive layer may be formed of the same material in the same process. For example, by depositing a conductive layer on the substrate 110 to be patterned by using a photo process and an etching process, the light blocking layer LB, the first capacitor electrode CE1, etc. may be formed. The first conductive layer may include molybdenum (Mo), aluminum (Al), copper (Cu), titanium (Ti), and/or the like, and may be a single layer or multiple layers.

A buffer layer 120 may be positioned on the first conductive layer. In case that the semiconductor layer A1 is formed, the buffer layer 120 may block impurities from the substrate 110 to improve the characteristics of the semiconductor layer A1, and may relieve stress of the semiconductor layer A1 by flattening the surface of the substrate 110. The buffer layer 120 may be an inorganic insulating layer that includes an inorganic insulating material such as a silicon nitride ($SiN_x$), a silicon oxide ($SiO_x$), or a silicon oxynitride ($SiO_xN_y$), and may be a single layer or multiple layers.

A semiconductor layer A1 (also referred to as an active layer) may be positioned on the buffer layer 120. The semiconductor layer A1 may include a first region, a second region, and a channel region positioned therebetween. The semiconductor layer A1 may include a semiconductor material such as an oxide semiconductor, amorphous silicon, polysilicon, or single crystal silicon. For example, the semiconductor layer A1 may include an oxide semiconductor material including at least one of zinc (Zn), indium (In), gallium (Ga), and tin (Sn). For example, the semiconductor layer A1 may include Indium-Gallium-Zinc Oxide (IGZO).

A first insulating layer 141 (also referred to as a first gate insulating layer) may be positioned on the semiconductor layer A1. The first insulating layer 141 may be an inorganic insulating layer that includes an inorganic insulating material such as a silicon nitride ($SiN_x$), a silicon oxide ($SiO_x$), or a silicon oxynitride ($SiO_xN_y$), and may be a single layer or multiple layers.

A second conductive layer (or referred to as a first gate conductive layer) that includes a gate electrode G1, a second capacitor electrode CE2, and the like may be positioned on the first insulating layer 141. The constituent elements included in the second conductive layer may be formed of the same material in the same process. For example, by depositing a conductive layer on the first insulating layer 141 to be patterned by using a photo process and an etching process, the gate electrode G1, the second capacitor electrode CE2, etc. may be formed. The gate electrode G1 may overlap the channel region of the semiconductor layer A1. The second capacitor electrode CE2 may overlap the first capacitor electrode CE1, and may form a first capacitor Cs together with the first capacitor electrode CE1. The second capacitor electrode CE2 and the gate electrode G1 may be different portions of the conductive pattern layer. The second capacitor electrode CE2 and the gate electrode G1 may be connected (e.g., electrically connected) to each other. The second conductive layer may include molybdenum (Mo), aluminum (Al), copper (Cu), silver (Ag), chromium (Cr), tantalum (Ta), titanium (Ti), and/or the like, and may be a single layer or multiple layers. For example, the second conductive layer may have a double layer, and may include a layer including aluminum (Al) and a layer including titanium (Ti).

After forming the second conductive layer, a doping process or a plasma treatment may be performed. The part of the semiconductor layer A1 covered by the gate electrode G1 may not be doped or plasma-treated, and the part of the semiconductor layer A1 that is not covered by the gate electrode G1 may be doped or plasma-treated, so it may have the same characteristics as a conductor. A region overlapping the gate electrode G1 on a plane among the semiconductor layer A1 may be a channel region.

A second insulating layer 142 (also referred to as a second gate insulating layer) may be positioned on the second conductive layer. The second insulating layer 142 may be an inorganic insulating layer that includes an inorganic insulating material such as a silicon nitride ($SiN_x$), a silicon oxide ($SiO_x$), or a silicon oxynitride ($SiO_xN_y$), and may be a single layer or multiple layers.

A third conductive layer (or referred to as a second gate conductive layer) that includes a third capacitor electrode CE3 and the like may be positioned on the second insulating layer 142. The constituent elements included in the third conductive layer may be formed of the same material in the same process. The third capacitor electrode CE3 may overlap the second capacitor electrode CE2, and may form a second capacitor Ch together with the second capacitor electrode CE2. The second capacitor Ch may stabilize the gate voltage of the transistor TR before the data voltage VDAT is applied. A second power voltage ELVSS may be applied to the third capacitor electrode CE3, but embodiments are not limited thereto. The third conductive layer may include molybdenum (Mo), aluminum (Al), copper (Cu), silver (Ag), chromium (Cr), tantalum (Ta), titanium (Ti), and/or the like, and may be a single layer or multiple layers. For example, the third conductive layer may be a double layer, and may include a layer including aluminum (Al) and a layer including titanium (Ti).

A third insulating layer 160 (also referred to as an interlayer insulating layer) may be positioned on the third conductive layer. The third insulating layer 160 may be an inorganic insulating layer that includes an inorganic insulating material such as a silicon nitride ($SiN_x$), a silicon oxide ($SiO_x$), or a silicon oxynitride ($SiO_xN_y$), and may be a single layer or multiple layers.

A fourth conductive layer (or referred to as a first data conductive layer) that includes a source electrode S1, a drain electrode D1, and the like may be positioned on the third insulating layer 160. The constituent elements included in the fourth conductive layer may be formed of the same material in the same process. The source electrode S1 and the drain electrode D1 may be respectively connected to the first region and the second region of the semiconductor layer A1 through contact holes formed in the insulating layers 141, 142, and 160. The source electrode S1 and the drain electrode D1 may form a transistor TR together with the gate electrode G1 and the semiconductor layer A1. The transistor TR may be an n-type transistor. For example, several transistors forming the pixel driving circuit unit may have substantially the same stacked structure as the transistor TR described above. The fourth conductive layer may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and/or the like, and may be a single layer or multiple layers. For example, the fourth conductive layer may have a triple layer structure of a lower layer including a refractory metal such as molybdenum, chromium, tantalum, and titanium, or an alloy thereof, a middle layer including an aluminum-based metal, a silver-based metal, and/or a copper-based metal with low resistivity, and an upper layer including a refractory metal such as molybdenum, chromium, tantalum, and titanium.

For example, the source electrode S1 may be connected to the light blocking layer LB through contact holes formed in the buffer layer 120 and the insulating layers 141, 142, and 160. Embodiments are not limited thereto, and the light blocking layer LB may be connected to the gate electrode G1 instead of the source electrode S1. For example, the gate electrode G1 may be connected to the light blocking layer LB through the contact holes formed in the buffer layer 120 and the first insulating layer 141. The light blocking layer of some transistors among transistors included in the pixel driving circuit unit may be connected to the source electrode, and the light blocking layer of other transistors may be connected to the gate electrode.

A fourth insulating layer 181 (also referred to as a first planarization layer) may be positioned on the fourth conductive layer. The fourth insulating layer 181 may include an organic insulating material such as a general-purpose polymer such as polymethyl methacrylate and polystyrene, a derivative of a polymer having a phenol-based group, an acryl-based polymer, an imide-based polymer (e.g., a polyimide), and a siloxane-based polymer. The fourth insulating layer 181 may be referred to as the first organic insulating layer.

A fifth conductive layer (or referred to as a second data conductive layer) that includes a connection wiring (or connection layer) EW and the like may be positioned on the fourth insulating layer 181. The constituent elements included in the fifth conductive layer may be formed of the same material in the same process. The connection wiring (or connection layer) EW may be connected to the drain electrode D1 of the transistor TR through a contact hole formed in the fourth insulating layer 181. The fifth conductive layer may include aluminum (Al), platinum (Pt), palladium (Pd), silver (Ag), magnesium (Mg), gold (Au), nickel (Ni), neodymium (Nd), iridium (Ir), chromium (Cr)), calcium (Ca), molybdenum (Mo), titanium (Ti), tungsten (W), copper (Cu), and/or the like, and may be a single layer or multiple layers. For example, the fifth conductive layer may have a triple layer structure of a lower layer including a refractory metal such as molybdenum, chromium, tantalum, and titanium, or an alloy thereof, a middle layer including an aluminum-based metal, a silver-based metal, and/or a copper-based metal with low resistivity, and an upper layer including a refractory metal such as molybdenum, chromium, tantalum, and titanium.

The connection wiring (or connection layer) EW may include a lower layer EWa, a middle layer EWb, and an upper layer EWc. For example, the lower layer EWa of the connection wiring EW may include titanium, the middle layer EWb may include aluminum, and the upper layer EWc may include titanium. The middle layer EWb may be positioned on the lower layer EWa of the connection wiring EW, and the upper layer EWc may be positioned on the middle layer EWb. For example, the middle layer EWb of the connection wiring EW may be positioned between the lower layer EWa and the upper layer EWc. The lower layer EWa of the connection wiring EW may be in contact with the drain electrode D1 of the transistor TR. The width of the middle layer EWb of the connection wiring EW may be narrower than the widths of the lower layer EWa and the upper layer EWc. At one side end portion of the connection wiring EW, the end portions of the lower layer EWa, the middle layer EWb, and the upper layer EWc may coincide (or may be aligned with each other). At another side end portion of the connection wiring EW, at least one end portion of the lower layer EWa, the middle layer EWb, and the upper layer EWc may not coincide (or may not be aligned with each other). At another side end portion of the connection wiring EW, the end portion of the middle layer EWb may be positioned more inside than the end portions of the lower layer EWa and the upper layer EWc. For example, the end portions of the lower layer EWa and the upper layer EWc may protrude more than the end portion of the middle layer EWb.

A fifth insulating layer 182 (also referred to as a second planarization layer) may be positioned on the fifth conductive layer. The fifth insulating layer 182 may include an organic insulating material such as a general-purpose polymer such as polymethyl methacrylate and polystyrene, a derivative of a polymer having a phenol-based group, an acryl-based polymer, an imide-based polymer (e.g., a polyimide), and a siloxane-based polymer. The fifth insulating layer 182 may be referred to as a second organic insulating layer.

An opening OP may be formed in the fifth insulating layer 182. The opening OP of the fifth insulating layer 182 may overlap at least part of the connection wiring EW. One side end portion of the connection wiring EW may be covered by the fifth insulating layer 182, and another side end portion of the connection wiring EW may not be covered by the fifth insulating layer 182 and may be exposed by the opening OP. At another side end portion of the connection wiring EW exposed by the opening OP, the end portions of the lower layer EWa and the upper layer EWc may protrude more than the end portion of the middle layer EWb.

A sixth conductive layer (or referred to as a pixel conductive layer) including a first electrode E1 and the like may be positioned on the fifth insulating layer 182. The constituent elements included in the sixth conductive layer may be formed of the same material in the same process. The first electrode E1 may be an anode of the light-emitting element ED. The first power voltage ELVDD may be applied to the first electrode E1. The first electrode E1 may be a part of the first power voltage line VL1 or may be connected (e.g., electrically connected) to the first power voltage line VL1. The first power voltage line VL1 may be included in the sixth conductive layer or in the aforementioned conductive layer such as the fifth conductive layer and the fourth conductive layer. The sixth conductive layer may be formed of a reflective conductive material or a semi-transmissive conductive material, or may be formed of a transparent conductive material. The sixth conductive layer may include a transparent conductive material such as indium-tin oxide (ITO) or indium-zinc oxide (IZO). The sixth conductive layer may include a metal or metal alloy such as lithium (Li), calcium (Ca), aluminum (Al), silver (Ag), magnesium (Mg), or gold (Au). The sixth conductive layer may be multi-layered, and may have a triple-layer structure such as, for example, ITO-silver (Ag)—ITO.

For example, the above-described wirings GL1, DL, VL1, and VL2 may be included in the first conductive layer, the second conductive layer, the third conductive layer, the fourth conductive layer, the fifth conductive layer, and/or the sixth conductive layer.

A pixel definition layer 190 (also referred to as a partition or a bank) may be positioned on the fifth insulating layer 182 and the first electrode E1. The pixel definition layer 190 may have a first opening O1 overlapping the first electrode E1. The first opening O1 of the pixel definition layer 190 may correspond to the light emitting region of the light-emitting element ED. The first opening O1 may overlap the central portion of the first electrode E1 and may not overlap the edge portion of the first electrode E1. Accordingly, the size of the first opening O1 may be smaller than the size of the first electrode E1. The pixel definition layer 190 may further have a second opening O2 overlapping the opening OP of the fifth insulating layer 182. The size of the second opening O2 of the pixel definition layer 190 may be larger than the size of the opening OP of the fifth insulating layer 182. The second opening O2 of the pixel definition layer 190 may have a shape surrounding the opening OP of the fifth insulating layer 182. The pixel definition layer 190 may include an organic insulating material such as a general-purpose polymer such as polymethyl methacrylate and poly-styrene, a derivative of a polymer having a phenol-based group, an acryl-based polymer, an imide-based polymer (e.g., a polyimide), and a siloxane-based polymer. The pixel definition layer 190 may include a positive type of photo-sensitive resin. In the portions where the first opening O1 and the second opening O2 of the pixel definition layer 190 are formed, the side surface of the pixel definition layer 190 may have a tapered shape. For example, the first opening O1 and the second opening O2 may have a shape in which the width gradually increases as the distance from the substrate 110 along the third direction z increases.

A separator pattern layer SP may be positioned on the pixel definition layer 190. The separator pattern layer SP may have a shape surrounding the light-emitting element ED on a plane. The light-emitting elements ED of the adjacent pixels PX may be distinguished by the separator pattern layer SP.

The separator pattern layer SP may include an organic insulating material. The separator pattern layer SP may include a negative type of photosensitive resin. The side surfaces of end portions (e.g., opposite end portions) of the separator pattern layer SP may have a reverse tapered shape. For example, the separator pattern layer SP may have a shape in which the width gradually increases as it goes away from the substrate 110 along the third direction z.

The middle layer EL may be positioned on the first electrode E1 and the pixel definition layer 190. The middle layer EL may include an emission layer EML and a functional layer FL.

The emission layer EML may be a layer in which an electro-optical conversion is made through a recombination of electrons and holes, and may include organic materials and/or inorganic materials that emit light of a certain color. The emission layer EML may be positioned within the first opening O1 of the pixel definition layer 190, and may overlap the first electrode E1. In some cases, a portion of the emission layer EML may also be positioned over the side surface and the top surface of the pixel definition layer 190. For example, the emission layer EML may be positioned on the upper surface of the pixel definition layer 190 adjacent to the first opening O1.

The functional layer FL may include at least one of a hole injection layer HIL, a hole transport layer HTL, an electron transport layer ETL, and an electron injection layer. The functional layer FL may be divided into a first functional layer FL1 positioned between the first electrode E1 and the emission layer EML and a second functional layer FL2 positioned between the emission layer EML and the second electrode E2. The first functional layer FL1 may include the hole injection layer HIL and/or the hole transport layer HTL. The second functional layer FL2 may include the electron transport layer ETL and/or the electron injection layer. The functional layer FL may be positioned over the entire display area DA. The functional layer FL may be positioned not only within the first opening O1 of the pixel definition layer 190, but also outside the first opening O1.

The functional layer FL may be disconnected (or divided) by the connection wiring EW in the opening OP of the fifth insulating layer 182. As described above, at the end portion of the connection wiring EW exposed by the opening OP, the end portions of the lower layer EWa and the upper layer EWc may protrude more than the end portion of the middle layer EWb. Accordingly, a cave structure in which middle layer EWb does not exist may be formed under the end portion of the upper layer EWc of the connection wiring EW, and the functional layer FL may be positioned inside the cave structure. The part of the functional layer FL positioned inside the cave structure may be disconnected (or separated) from the part of the functional layer FL positioned on the upper layer EWc of the connection wiring EW to be separated.

For example, the functional layer FL may be disconnected (or divided) by the separator pattern layer SP. As described above, the separator pattern layer SP may have a reverse tapered shape. The cave structure may be formed below the separator pattern layer SP, and the functional layer FL may be positioned inside the cave structure. The part of the functional layer FL positioned inside the cave structure may be disconnected (or separated) from the part of the functional layer FL positioned on the separator pattern layer SP to be separated.

As described above, the functional layer FL may be disconnected (or divided) by the connection wiring EW and may be disconnected (or divided) by the separator pattern layer SP. The adjacent functional layers FL disconnected (or divided) by the separator pattern layer SP may not be connected to each other at all, and may be completely separated. The adjacent functional layers FL disconnected (or divided) by connection wiring EW may be connected to each other in other regions except for a region corresponding to the cave structure formed under the end portion of the upper layer EWc of the connection wiring EW. For example, the disconnection of the functional layer FL by the separator pattern layer SP may be for the separation between the adjacent pixels PX and the separation between the display area DA and the peripheral area PA, and the disconnection of the functional layer FL by the connection wiring EW may be for the connection between the second electrode E2 and the connection wiring EW.

The second electrode E2 may be positioned on the functional layer FL. The second electrode E2 together with the first electrode E1 and the middle layer EL may form the light-emitting element ED such as an organic light emitting diode or an inorganic light emitting diode. The first electrode E1 may be the anode of the light-emitting element ED, and the second electrode E2 may be the cathode of the light-emitting element ED. Like the functional layer FL, the second electrode E2 may be positioned over the entire display area DA. The second electrode E2 may be positioned not only within the first opening O1 of the pixel definition layer 190, but also outside the first opening O1.

The second electrode E2 may be disconnected (or divided) by the connection wiring EW in the opening OP of the fifth insulating layer 182. As described above, a cave structure may be formed under the end portion of the upper layer EWc of the connection wiring EW, and the second electrode E2 may be positioned inside the cave structure. The part of the second electrode E2 positioned inside the cave structure may not be connected to the part of the second electrode E2 positioned on the upper layer EWc of the connection wiring EW, and may be disconnected (or divided). Inside the cave structure, the second electrode E2 may be connected to the connection wiring EW. Accordingly, the second electrode E2 may be connected (e.g., electrically connected) to the drain electrode D1 of the transistor TR through the connection wiring EW. The second electrode E2 may be in contact with the side surface of the middle layer EWb of the connection wiring EW. The second electrode E2 may also be in contact with the upper surface of the lower layer EWa of the connection wiring EW. Inside the cave structure, the second electrode E2 may cover the side surface of the end portion of the functional layer FL. The second electrode E2 positioned on the upper layer EWc of the connection wiring EW may be in contact with the upper surface of the end portion of the upper layer EWc. On the upper layer EWc of the connection wiring EW, the second electrode E2 may cover the side surface of the end portion of the functional layer FL.

For example, the second electrode E2 may be disconnected (or divided) by the separator pattern layer SP. As described above, the separator pattern layer SP may have a reverse tapered shape, and the second electrode E2 may be positioned inside the cave structure formed below the separator pattern layer SP. The portion of the second electrode E2 positioned inside the cave structure may be disconnected (or divided) from the portion of the second electrode E2 positioned on the separator pattern layer SP. Inside the cave structure, the second electrode E2 may cover the side surface of the end portion of the functional layer FL. Accordingly, the second electrodes E2 of the adjacent pixels PX may not be electrically connected by the separator pattern layer SP, but may be separated.

As described above, the second electrode E2 may be disconnected (or divided) by the connection wiring EW and may be disconnected (or divided) by the separator pattern layer SP. The adjacent second electrodes E2 that are disconnected (or divided) by the separator pattern layer SP may not be connected to each other at all, and may be completely separated. The adjacent second electrodes E2, which are disconnected (or divided) by the connection wiring EW, may be connected to each other in other regions except for a region corresponding to the cave structure formed under the end portion of the upper layer EWc of the connection wiring EW. For example, the disconnection of the second electrode E2 by the separator pattern layer SP may be for separation between the adjacent pixels PX and the separation between the display area DA and the peripheral area PA, and the disconnection of the second electrode E2 by the connection wiring EW may be for the connection between the second electrode E2 and the middle layer EWb of the connection wiring EW.

The second electrode E2 may be made of a metal or metal alloy having a low work function such as calcium (Ca), barium (Ba), magnesium (Mg), aluminum (Al), and silver (Ag) to have light transmittance by forming a thin layer. The second electrode E2 may include a transparent conductive oxide such as indium-tin oxide (ITO) or indium-zinc oxide (IZO).

A capping layer may be positioned on the second electrode E2. The capping layer may improve optical efficiency by adjusting a refractive index. An encapsulation layer may be positioned on the capping layer. The encapsulation layer encapsulates the light-emitting element ED to prevent penetration of moisture or oxygen from the outside. The encapsulation layer may be a thin film encapsulation layer including at least one inorganic layer and at least one organic layer. The encapsulation layer may be provided in a form of a substrate and may be bonded to the substrate 110. A touch sensor layer may be positioned on the encapsulation layer, and an antireflection layer for reducing external light reflection may be positioned on the touch sensor layer.

The display device according to an embodiment may include pixels. In the following, the arrangement form of pixels positioned in the display area of the display device according to an embodiment will be described with reference to FIG. 5.

Figure 5:
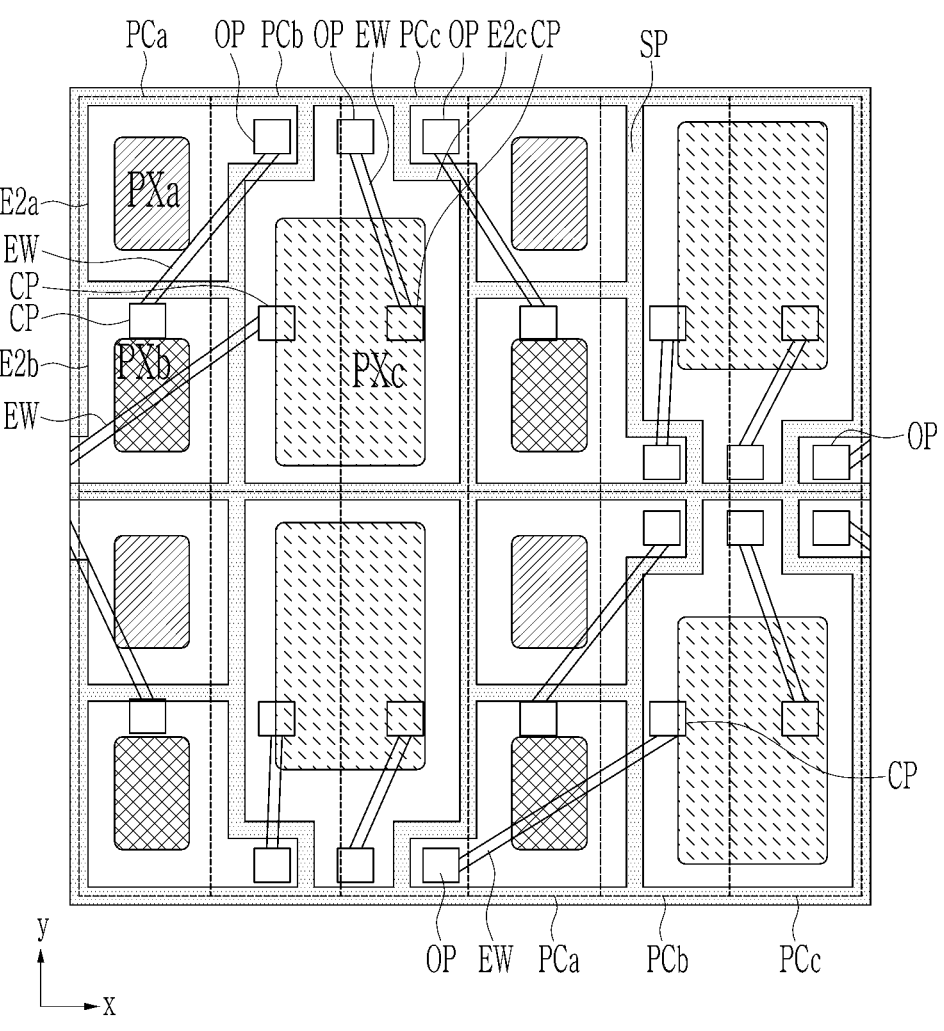
FIG. 5 is a schematic top plan view showing a display device according to an embodiment.

FIG. 5 is a schematic top plan view showing a display device according to an embodiment. FIG. 5 shows pixels positioned in the display area of the display device according to an embodiment.

As shown in FIG. 5, the display device according to an embodiment may include pixels PXa, PXb, and PXc. Each of the pixels PXa, PXb, and PXc may include a light emitting part and a non-light emitting part, and the light emitting part may correspond to the region in which the first opening O1 is formed in FIG. 4. The pixels PXa, PXb, and PXc may include a first pixel PXa, a second pixel PXb, and a third pixel PXc. Although twelve pixels are shown in FIG. 5, this shows some pixels, and pixels PXa, PXb, and PXc may be regularly disposed in the matrix form in the display area DA. In an embodiment, the first pixel PXa and the second pixel PXb may be disposed alternately along the second direction y in the odd-numbered column, and the third pixels PXc may be disposed in the even-numbered column. The arrangement form of the pixels PXa, PXb, and PXc is not limited thereto, and may be variously changed.

The first pixel PXa, the second pixel PXb, and the third pixel PXc may display different colors, and may each display one of the primary colors. For example, one of the first pixel PXa, the second pixel PXb and the third pixel PXc may display red, another one of the first pixel PXa, the second pixel PXb and the third pixel PXc may display green, and the other of the first pixel PXa, the second pixel PXb and the third pixel PXc may display blue. For example, the first pixel PXa may display red, the second pixel PXb may display green, and the third pixel PXc may display blue. The plane size of the first pixel PXa and the plane size of the second pixel PXb may be similar. The region of the third pixel PXc may be wider than the region of the first pixel PXa and the region of the second pixel PXb. The colors displayed by the first pixel PXa, the second pixel PXb, and the third pixel PXc, and the plane sizes of the first pixel PXa, the second pixel PXb, and the third pixel PXc are not limited thereto, and may be variously changed.

The first pixel PXa, the second pixel PXb, and the third pixel PXc may include a first electrode and second electrodes E2$a$, E2$b$, and E2$c$, respectively. As described above, the second electrodes E2$a$, E2$b$, and E2$c$ of the pixels PXa, PXb, and PXc may be separated from each other by the separator pattern layer SP.

The separator pattern layer SP may be integrally formed (or may continuously extend) by being connected to each other. For example, the separator pattern layer SP may not be separated. For example, the separator pattern layer SP positioned between the first pixel PXa and the second pixel PXb, the separator pattern layer SP positioned between the second pixel PXb and the third pixel PXc, and the separator pattern layer SP positioned between the first pixel PXa and the third pixel PXc may be connected to each other.

The pixels PXa, PXb, and PXc may include light-emitting elements and pixel driving circuit units PCa, PCb, and PCc connected thereto. A rectangle region shown by a dotted line in the drawing may be a region of each of the pixel driving circuit units PCa, PCb, and PCc. To increase the light emitting region of each of the pixels PXa, PXb, and PXc, the region in which each of the pixel driving circuit units PCa, PCb, and PCc is positioned may not coincide with the light emitting region of a corresponding one of the pixels PXa, PXb, and PXc. For example, the first pixel driving circuit unit PCa of the first pixel PXa, the second pixel driving circuit unit PCb of the second pixel PXb, and the third pixel driving circuit unit PCc of the third pixel PXc may be disposed alternately in the first direction x. As described above, since the light emitting region and the regions in which the pixel driving circuit units PCa, PCb, and PCc are positioned do not coincide (or do not overlap each other), the connection wiring EW may be properly disposed to efficiently secure the light emitting region. One side end portion of the connection wiring EW may be connected to the drain electrode D1 of the transistor TR. The connection part CP of the drain electrode D1 of the transistor TR of each of the pixel driving circuit units PCa, PCb, and PCc, and the connection wiring EW, may be disposed at the approximate center portion of each of the pixel driving circuit units PCa, PCb, and PCc at a certain interval (or distance) along the first direction x. Another side end portion of the connection wiring EW may be connected to the second electrodes E2$a$, E2$b$, and E2$c$ of pixels PXa, PXb, and PXc within the opening OP of the second planarization layer as the fifth insulating layer 182. The connection part of each of the second electrodes E2$a$, E2$b$, and E2$c$ of pixels PXa, PXb, and PXc and the connection wiring EW may be disposed on the upper side or the lower side of the third pixel PXc in a line with a certain interval (or distance) along the first direction x. However, the position of the connection wiring EW, the position of the connection part CP of the connection wiring EW and each of the pixel driving circuit units PCa, PCb, and PCc, and the position of the connection part of the connection wiring EW and each of the second electrode E2$a$, E2$b$, E2$c$, etc. are not limited thereto, and may be variously changed.

Hereinafter, the structure of the peripheral area of the display device according to an embodiment will be described with reference to FIG. 6 and FIG. 7.

Figure 6:
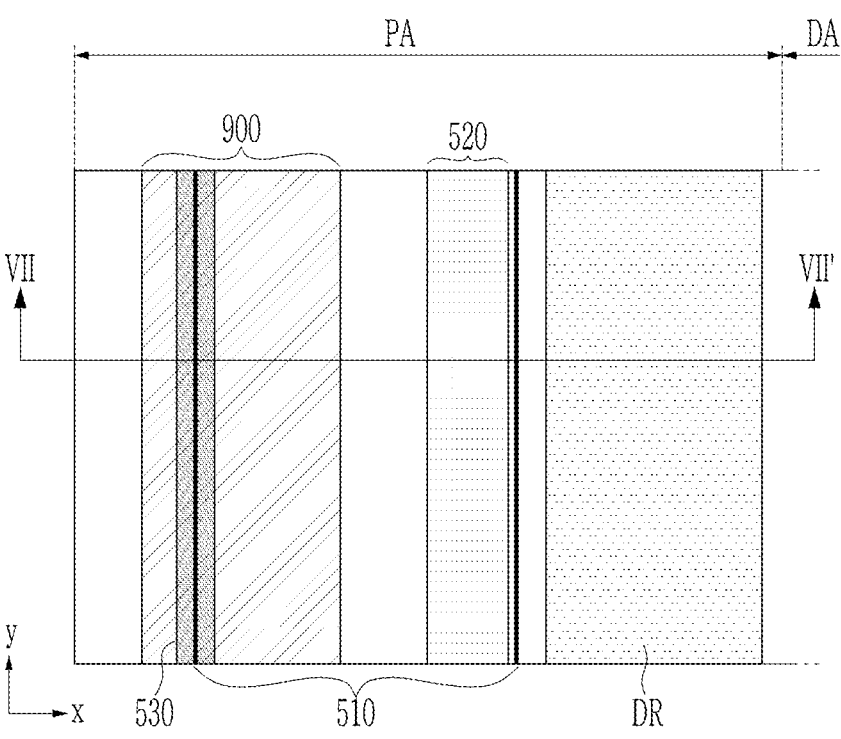
FIG. 6 is a schematic top plan view showing a display device according to an embodiment.
Figure 7:
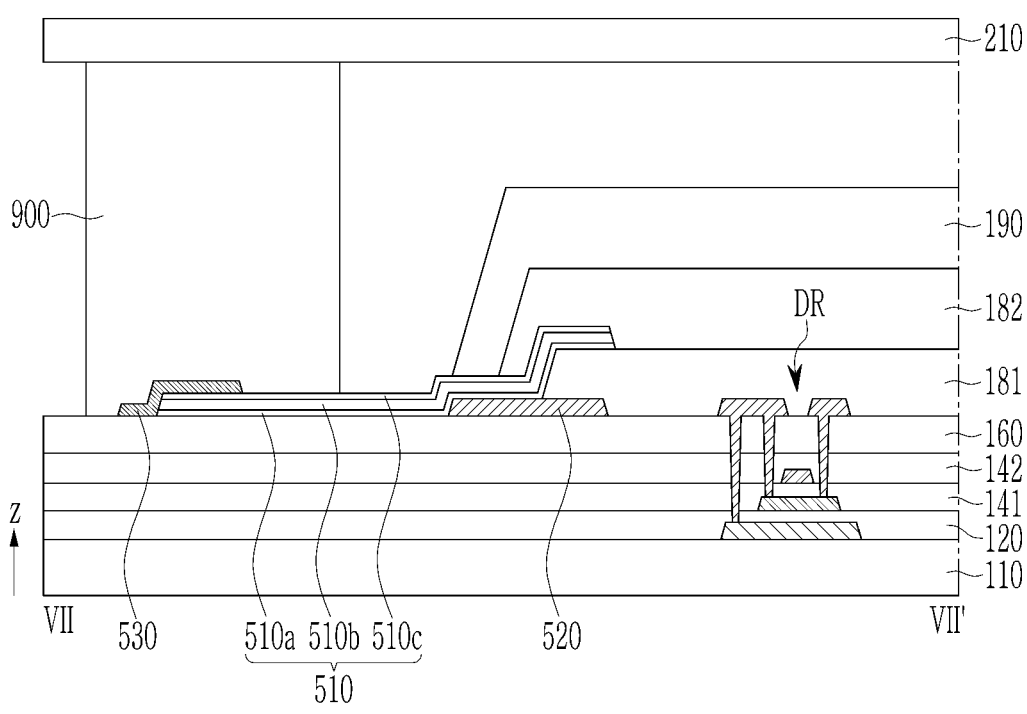
FIG. 7 is a schematic cross-sectional view taken along line VII-VII' of FIG. 6.

FIG. 6 is a schematic top plan view showing a display device according to an embodiment, and FIG. 7 is a schematic cross-sectional view taken along line VII-VII' of FIG. 6. FIG. 6 and FIG. 7 show the peripheral area of the display device according to an embodiment.

As shown in FIG. 6 and FIG. 7, the display device according to an embodiment may include a power voltage supply line 510. The power voltage supply line 510 may be positioned in the peripheral area PA. The power voltage supply line 510 may have a planar shape surrounding the display area DA. For example, FIG. 6 and FIG. 7 show a part of the left edge portion of the display device according to an embodiment, and the power voltage supply line 510 extends in the second direction y along the edge portion of the display area DA. For example, the power voltage supply line 510 may have a shape extending in the first direction x spaced apart from the upper edge portion of the display area DA, and may have a shape extending in the second direction y spaced apart from the right edge portion of the display area DA. For example, the power voltage supply line 510 may be spaced apart from the display area DA by a certain interval (or distance) to have a shape surrounding the display area DA.

The power voltage supply line 510 may be positioned in the fifth conductive layer. The power voltage supply line 510 and the connection wiring EW may be positioned on the same layer. As described above, the connection wiring EW may have a triple layer structure. Accordingly, the power voltage supply line 510 may include a lower layer 510$a$, a middle layer 510$b$, and an upper layer 510$c$. For example, the lower layer 510$a$ of the power voltage supply line 510 may include titanium, the middle layer 510$b$ may include aluminum, and the upper layer 510$c$ may include titanium. The middle layer 510$b$ may be positioned on the lower layer 510$a$ of the power voltage supply line 510, and the upper layer 510$c$ may be positioned on the middle layer 510$b$. The lower layer 510$a$, the middle layer 510$b$, and the upper layer 510$c$ of the power voltage supply line 510 may have substantially the same width. At end portions (e.g., opposite end portions) of the power voltage supply line 510, the end portions of the lower layer 510$a$, the middle layer 510$b$, and the upper layer 510$c$ may coincide (or may be aligned with each other). For example, some of the lower layer 510$a$, the middle layer 510$b$, and the upper layer 510$c$ may not protrude.

The power voltage supply line 510 may transmit a substantially constant voltage. For example, the power voltage supply line 510 may transmit the first power voltage ELVDD. The power voltage supply line 510 may be a part of the first power voltage line VL1 or may be connected (e.g., electrically connected) to the first power voltage line VL1. The power voltage supply line 510 may extend to the display area DA and may be connected to the first electrode E1, and may transmit the first power voltage ELVDD to the first electrode E1. In another example, the power voltage supply line 510 may be connected to the first electrode E1 through a separate first power voltage line VL1, and may transmit the first power voltage ELVDD to the first electrode E1. However, embodiments are not limited thereto, and the power voltage supply line 510 may be wiring that transmits a voltage other than the first power voltage ELVDD. For example, the power voltage supply line 510 may transmit the second power voltage ELVSS.

The display device according to an embodiment may further include auxiliary wiring 520 connected to the power voltage supply line 510. The auxiliary wiring 520 may overlap the power voltage supply line 510. The auxiliary wiring 520 may be positioned in the peripheral area PA and may have a planar shape surrounding the display area DA. The auxiliary wiring 520 may have a narrower width than the power voltage supply line 510.

The auxiliary wiring 520 may be positioned in the fourth conductive layer. The auxiliary wiring 520 and the source electrode S1 and the drain electrode D1 of the transistor TR may be positioned on the same layer (e.g., third insulating layer 160). A fourth insulating layer 181 may be positioned between the fourth conductive layer and the fifth conductive layer. The fourth insulating layer 181 may not be formed in at least a partial region of the peripheral area PA, and the power voltage supply line 510 may be connected to the auxiliary wiring 520 in the corresponding region. For example, the lower layer 510a of the power voltage supply line 510 may be in contact with the auxiliary wiring 520.

The display device according to an embodiment may further include an opposing substrate 210 positioned on the substrate 110 and an encapsulation member 900 positioned between the opposing substrate 210 and the substrate 110.

The substrate 110 and the opposing substrate 210 may be spaced apart at a certain interval (or distance) along the third direction z, and be positioned to face each other. The substrate 110 and the opposing substrate 210 may have approximately similar sizes and shapes. The substrate 110 and opposing substrate 210 may be made of a rigid substrate.

The encapsulation member 900 may be positioned in the peripheral area PA. The encapsulation member 900 may be formed in a shape surrounding the display area DA on a plane. Accordingly, the light-emitting element ED and the like of each pixel PX positioned in the display area DA may be enclosed and sealed by the encapsulation member 900. Accordingly, moisture or oxygen may be prevented from penetrating into the display device and affecting the light-emitting element ED. The substrate 110 and the opposing substrate 210 may be combined by the encapsulation member 900. The encapsulation member 900 may be formed by coating a glass material such as a frit or an organic material such as an epoxy to the peripheral area PA between the substrate 110 and the opposing substrate 210 and curing the coated material by irradiating laser or UV light. In case that the organic layer is positioned in the region irradiated with laser or UV light, the organic layer may be damaged by the laser or UV light, and defects may occur by affecting other elements in the vicinity. In the display device according to an embodiment, the organic layer may not be positioned in at least a partial region of the peripheral area PA. For example, the organic layer of the region overlapping the encapsulation member 900 and positioned adjacent thereto may be removed by the patterning. For example, the fourth insulating layer 181, the fifth insulating layer 182, and the pixel definition layer 190 positioned around the encapsulation member 900 may be removed. Accordingly, the encapsulation member 900 may not overlap the fourth insulating layer 181, the fifth insulating layer 182, and the pixel definition layer 190.

The encapsulation member 900 may overlap the power voltage supply line 510. A portion of the power voltage supply line 510 may overlap the encapsulation member 900, and the remaining portion of the power voltage supply line 510 may not overlap the encapsulation member 900. The organic layer may not be formed around the encapsulation member 900, and at least a portion of the power voltage supply line 510 may not be covered by the organic layer. A side of the power voltage supply line 510 may not overlap the fourth insulating layer 181, the fifth insulating layer 182, and the pixel definition layer 190. Another side of the power voltage supply line 510 may overlap the fourth insulating layer 181, the fifth insulating layer 182, and the pixel definition layer 190. For example, the side of the power voltage supply line 510 may be positioned relatively farther from the display area DA than the another side of the power voltage supply line 510. The fourth insulating layer 181 may not be positioned below the side of the power voltage supply line 510, and the side of the power voltage supply line 510 may be positioned (e.g., directly positioned) on the third insulating layer 160. The fourth insulating layer 181 may be positioned below the another side of the power voltage supply line 510. The fifth insulating layer 182 and pixel definition layer 190 may not be positioned above the side of the power voltage supply line 510, and the encapsulation member 900 may be positioned (e.g., directly positioned) on the side of the power voltage supply line 510. The fifth insulating layer 182 and the pixel definition layer 190 may be positioned above the another side of the power voltage supply line 510. For example, the side of the power voltage supply line 510 may be covered by the encapsulation member 900, and the another side of the power voltage supply line 510 may be covered by the fifth insulating layer 182 and the pixel definition layer 190.

The display device according to an embodiment may further include a capping member 530 positioned between the power voltage supply line 510 and the encapsulation member 900. The capping member 530 may overlap the power voltage supply line 510 and the encapsulation member 900. The capping member 530 may be positioned in the peripheral area PA and may have a planar shape surrounding the display area DA. The capping member 530 may have a rod shape extending along the first direction x or the second direction y. The capping member 530 may have a narrower width than the power voltage supply line 510. The capping member 530 may not overlap the auxiliary wiring 520. For example, the capping member 530 may overlap a side of the power voltage supply line 510, and the auxiliary wiring 520 may overlap another side of the power voltage supply line 510. For example, the capping member 530 may not overlap the another side of the power voltage supply line 510, and the auxiliary wiring 520 may not overlap the side of the power voltage supply line 510. However, this is only an example, and the overlapping relationship between the capping member 530, the auxiliary wiring 520, and the power voltage supply line 510 may be variously changed.

One side end portion of the power voltage supply line 510 may be covered by the capping member 530, and the encapsulation member 900 may be positioned on the capping member 530. The upper surface and the side surface of one side end portion of the power voltage supply line 510 may be covered by the capping member 530. The capping member 530 may be positioned (e.g., directly positioned) on the power voltage supply line 510. The capping member 530 may be made of a conductive material. For example, the capping member 530 may be formed of a transparent conductive oxide such as indium-tin oxide (ITO) or indium-zinc oxide (IZO), or a metal material such as molybdenum (Mo), aluminum (Al), copper (Cu), silver (Ag), chromium (Cr), tantalum (Ta), titanium (Ti), or the like. The capping member 530 may be formed of multiple layers, and for example, may have a triple layer structure such as Ti/Al/Ti or ITO/Ag/ITO. In case that the capping member 530 is made of a conductive material, it may function to lower the resistance of the power voltage supply line 510, and thus may prevent a voltage drop occurred by the power voltage supply line 510. However, embodiments are not limited thereto, and the capping member 530 may be made of an insulating material. For example, the capping member 530 may be made of an inorganic insulating material such as a silicon nitride ($SiN_x$), a silicon oxide ($SiO_x$), or a silicon oxynitride ($SiO_xN_y$). In case that the capping member 530 is made of an insulating material, it is possible to prevent the power voltage supply line 510 from being short-circuited with other wiring due to impurities such as conductive particles generated during the process.

As described above, the connection wiring EW positioned in the fifth conductive layer may have the structure in which the end portions of the lower layer EWa and the upper layer EWc are protruded more than the end portion of the middle layer EWb in the part of the connection wiring EW exposed by the opening OP. With this structure, the middle layer EWb of the connection wiring EW may be smoothly connected to the second electrode E2. To form such a structure, the fifth insulating layer 182 may be formed on the fifth conductive layer and patterned to form the opening OP, and the entire surface etching may be performed to etch a portion where the fifth conductive layer is exposed. For example, an etchant capable of selectively etching the middle layer EWb of the connection wiring EW may be used. Accordingly, the middle layer EWb of the connection wiring EW may be etched, and the lower layer EWa and the upper layer EWc may not be etched. At another side end portion of the connection wiring EW exposed by the opening OP after the etching process is performed, at least one end portion of the lower layer EWa, the middle layer EWb, and the upper layer EWc may not coincide (or may not be aligned with each other). The end portion of the middle layer EWb may be positioned more inside than the end portions of the lower layer EWa and the upper layer EWc. For example, the end portions of the lower layer EWa and the upper layer EWc may protrude more than the end portion of the middle layer EWb.

In case that the end portion of the power voltage supply line 510 is exposed in the process of forming the structure in which some layers of another side end portion of the connection wiring EW are protruded, the end portion of the power voltage supply line 510 may also have a structure in which some layers of the power voltage supply line 510 are protruded. The power voltage supply line 510 may have a structure in which a portion of the power voltage supply line 510 is not covered by the organic layer, and the end portion of the power voltage supply line 510 may be continuously exposed during several etching processes in the subsequent process, thereby causing damage. For example, the end portion of the upper layer 510c of the power voltage supply line 510 may be deformed, such as being broken or lifted. In the display device according to an embodiment, since the end portion of the power voltage supply line 510 is covered by the capping member 530, the end portion of the power voltage supply line 510 may not be exposed in the process of forming the structure in which some layers of another side end portion of the connection wiring EW are protruded. Therefore, the end portions of the lower layer 510a, the middle layer 510b, and the upper layer 510c may coincide (or may be aligned with each other) at end portions (e.g., opposite end portions) of the power voltage supply line 510, and the end portion of the upper layer 510c of the power voltage supply line 510 may be prevented from having the deformation such as being broken or lifted. Since the end portion of the power voltage supply line 510 is covered by the capping member 530 in the subsequent process, the damage to the end portion of the power voltage supply line 510 may be prevented. The capping member 530 may be formed immediately after the process of forming the fifth conductive layer. After the capping member 530 is formed, a process of forming the fifth insulating layer 182 may be performed.

The display device according to an embodiment may further include a driving circuit unit DR. The driving circuit unit DR may be positioned in the peripheral area PA and may generate a certain signal to be transmitted to the pixel PX positioned in the display area DA through certain wiring. For example, the driving circuit unit DR may include a gate driver that generates a gate signal and applies the gate signal to the gate lines. The driving circuit unit DR may be positioned on the substrate 110 and may include several electrodes and wiring positioned in the first conductive layer, the second conductive layer, and the third conductive layer. The organic layer such as the fourth insulating layer 181, the fifth insulating layer 182, and the pixel definition layer 190 may be positioned on the driving circuit unit DR. For example, the organic layer may not be entirely removed from the peripheral area PA, and the organic layer may be positioned in some regions of the peripheral area PA. The driving circuit unit DR may be positioned between the display area DA and the power voltage supply line 510 on a plane. For example, the driving circuit unit DR may be positioned relatively closer to the display area DA than the power voltage supply line 510.

The display device according to an embodiment will be described with reference to FIG. 8 and FIG. 9, as follows.

Figure 8:
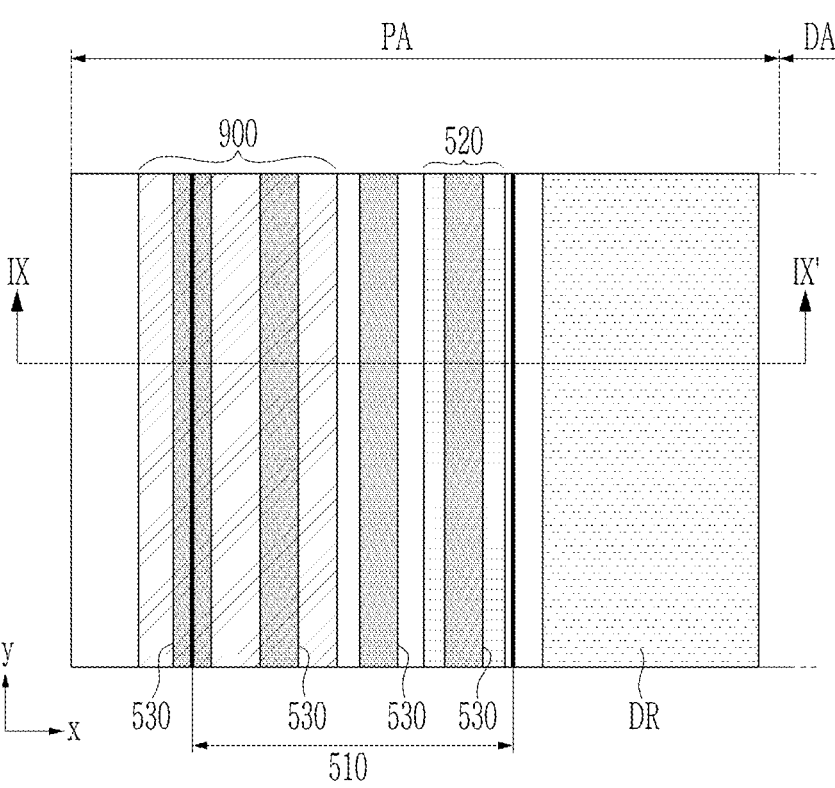
FIG. 8 is a schematic top plan view showing a display device according to an embodiment.
Figure 9:
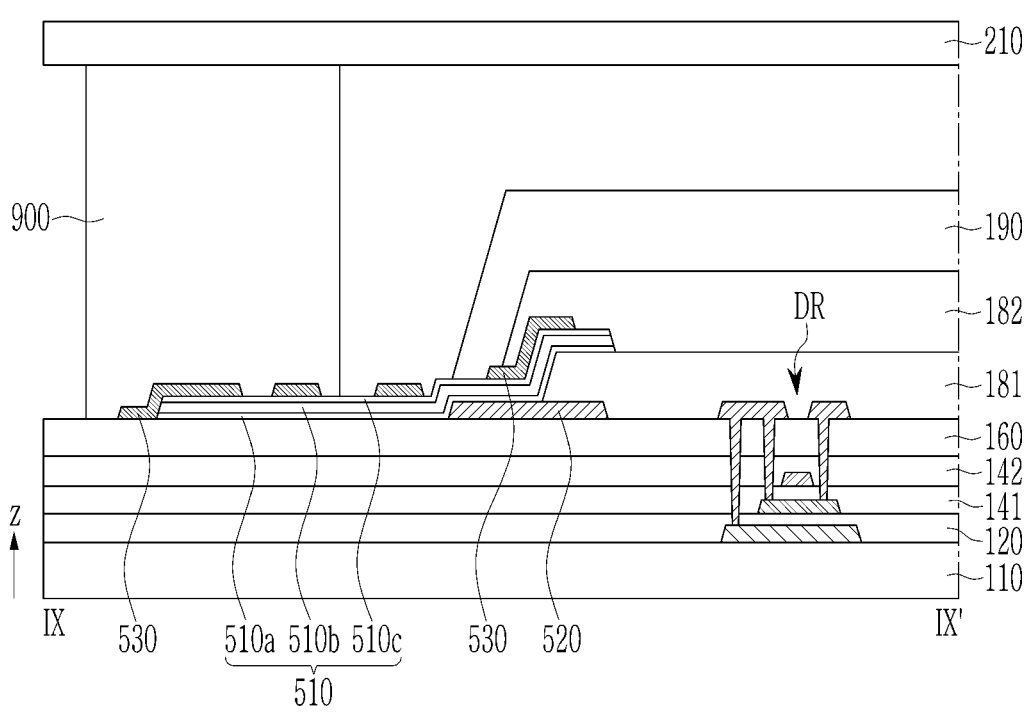
FIG. 9 is a schematic cross-sectional view taken along line IX-IX' of FIG. 8.

The display device according to the embodiment of FIG. 8 and FIG. 9 has the same parts as the display device according to the embodiment of FIG. 1 to FIG. 7 so that the redundant description of the same parts is omitted for descriptive convenience. In the embodiment of FIGS. 8 and 9, the shape of the capping member is partly different from that of the previous embodiment, which will be further described below.

FIG. 8 is a schematic top plan view showing a display device according to an embodiment, and FIG. 9 is a schematic cross-sectional view taken along line IX-IX' of FIG. 8. FIG. 8 and FIG. 9 show the peripheral area of the display device according to an embodiment.

As shown in FIG. 8 and FIG. 9, the display device according to an embodiment may include a power voltage supply line 510 positioned in the peripheral area PA, an encapsulation member 900 overlapping the power voltage supply line 510, and a capping member 530 positioned between the power voltage supply line 510 and the encapsulation member 900. The power voltage supply line 510 may be positioned in the fifth conductive layer. The power voltage supply line 510 and the connection wiring EW may be positioned on the same layer. The power voltage supply line 510 may include a lower layer 510a, a middle layer 510b, and an upper layer 510c. The encapsulation member 900 may be positioned between the substrate 110 and the opposing substrate 210, and an organic layer may not be formed around the encapsulation member 900. A side of the power voltage supply line 510 may overlap the encapsulation member 900 and may not be covered by other organic layers. One side end portion of the power voltage supply line 510 may be covered by the capping member 530. The upper surface and the side surface of one side end portion of the power voltage supply line 510 may be covered by the capping member 530, and the damage to the power voltage supply line 510 may be prevented during the process. The capping member 530 may be made of a conductive material, and may function to lower the resistance of the power voltage supply line 510 by being connected to the power voltage supply line 510. However, embodiments are not limited thereto, and the capping member 530 may be made of an inorganic insulating material.

In the previous embodiment, the capping member 530 may have a single rod shape, and in the embodiment of FIG. 8 and FIG. 9, the capping member 530 may have a shape of rods. Rods may have a substantially constant width. However, embodiments are not limited thereto, and at least one of rods may have different widths. Rods may extend in a direction parallel to each other, and may be disposed apart from each other at a regular interval (or distance). For example, rods may extend along the second direction y. In another region, for example, rods may extend along the first direction x in the upper edge portion of the display device according to an embodiment. The capping member 530 may cover another side end portion of the power voltage supply line 510 as well as one side end portion of the power voltage supply line 510. A portion of the capping member 530 may overlap the encapsulation member 900, and another portion of the capping member 530 may not overlap the encapsulation member 900. A part of the capping member 530 may not overlap the auxiliary wiring 520, and another part of the capping member 530 may overlap the auxiliary wiring 520.

The display device according to an embodiment will be described with reference to FIG. 10, as follows.

Figure 10:
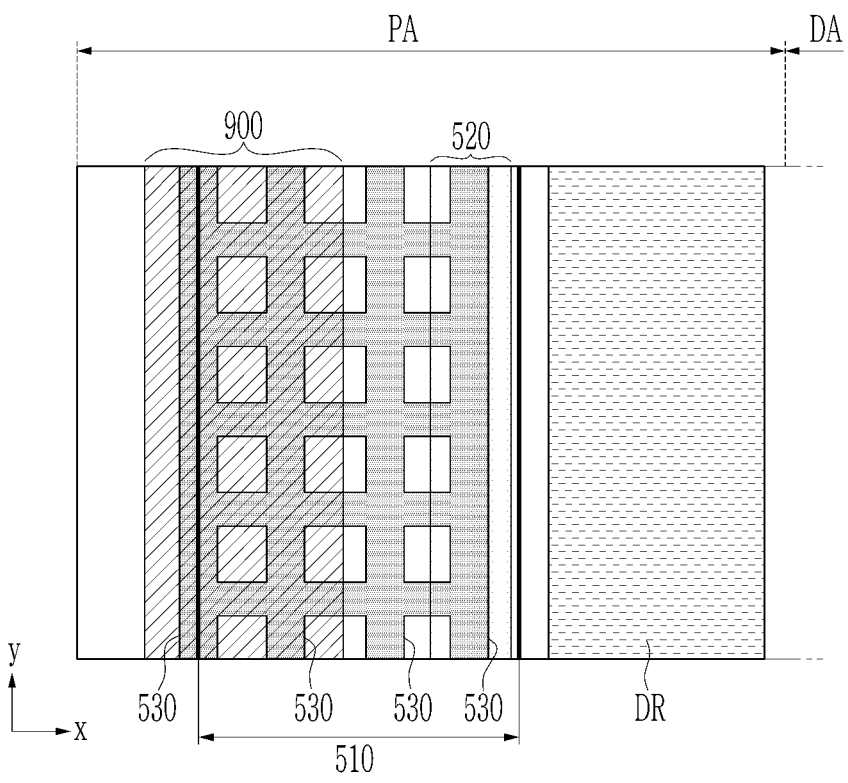
FIG. 10 is a schematic top plan view showing a display device according to an embodiment.

The display device according to an embodiment of FIG. 10 is the same as most of the display device of the embodiment of FIG. 1 to FIG. 7 so that the redundant description for the same parts is omitted for descriptive convenience. In the embodiment of FIG. 10, the shape of the capping member is partly different from that of the previous embodiment, which will be further described below.

FIG. 10 is a schematic top plan view showing a display device according to an embodiment. FIG. 10 shows a peripheral area of a display device according to an embodiment.

As shown in FIG. 10, the display device according to an embodiment may include a power voltage supply line 510 positioned in the peripheral area PA, an encapsulation member 900 overlapping the power voltage supply line 510, and a capping member 530 positioned between the power voltage supply line 510 and the encapsulation member 900.

In the embodiment of, e.g., FIGS. 6 and 8, the capping member 530 may have the rod shape on a plane, and in the embodiment of FIG. 10, the capping member 530 may have a net shape on a plane. The capping member 530 may include a portion extending in the first direction x and a portion extending in the second direction y. The capping member 530 may include a portion extending in a direction parallel to the power voltage supply line 510 and a portion extending in a direction perpendicular to the power voltage supply line 510. Each part forming the capping member 530 may have a substantially constant width or may have different widths. However, embodiments are not limited thereto, and the planar shape of the capping member 530 may be variously changed.

The display device according to an embodiment will be described with reference to FIG. 11 and FIG. 12, as follows.

Figure 11:
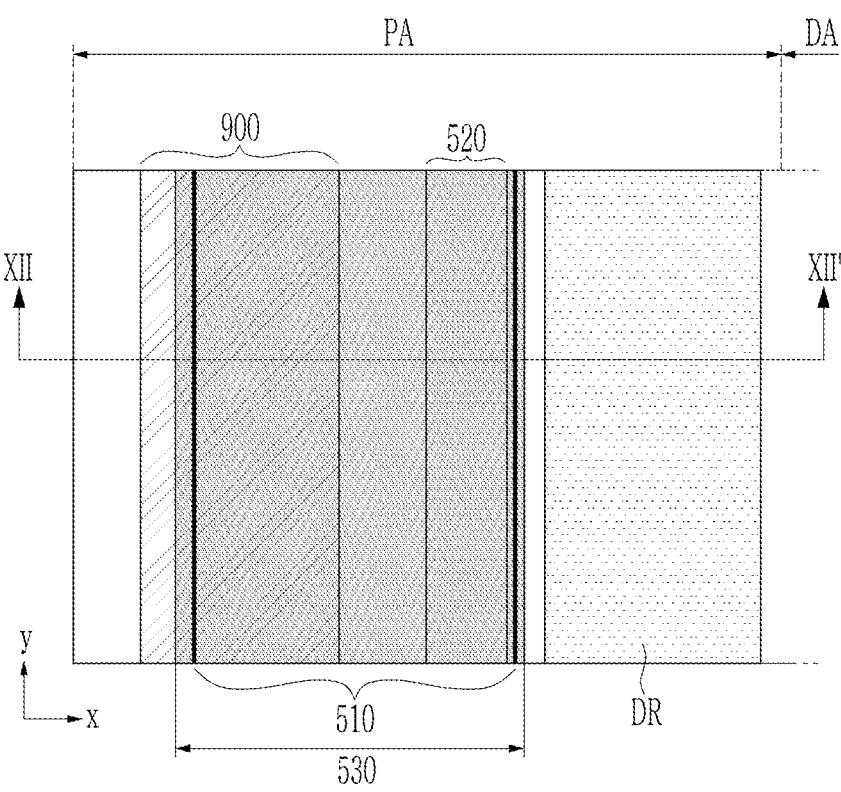
FIG. 11 is a schematic top plan view showing a display device according to an embodiment.
Figure 12:
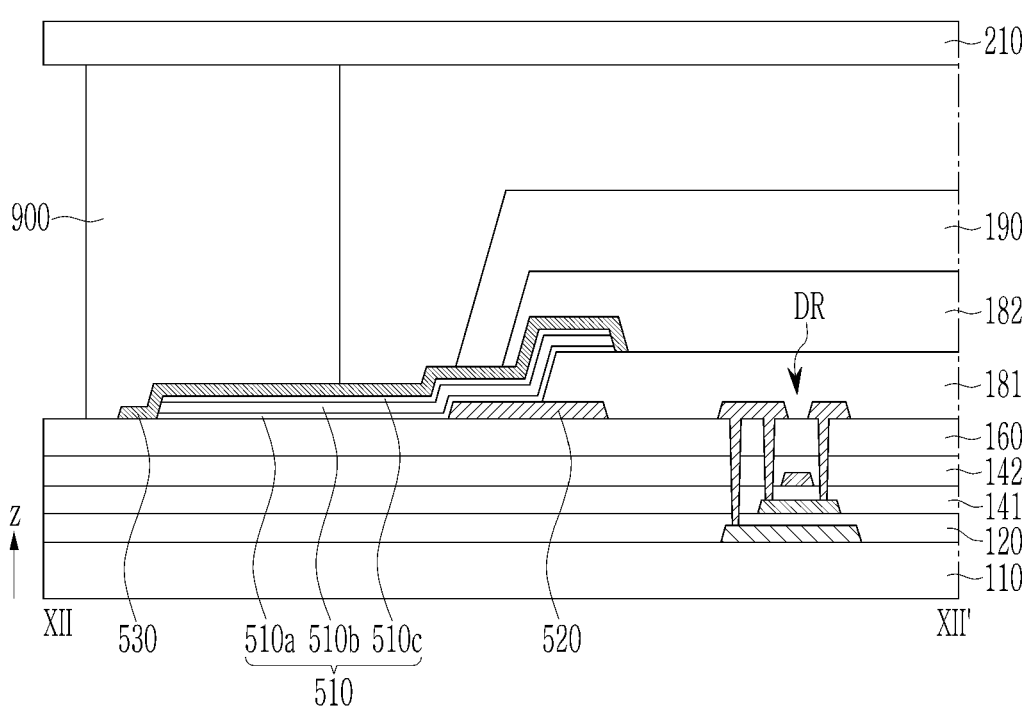
FIG. 12 is a schematic cross-sectional view taken along line XII-XII' of FIG. 11.

The display device according to an embodiment of FIG. 11 and FIG. 12 is the same as most of the display device of the embodiment of FIG. 1 to FIG. 7 so that the redundant description for the same parts is omitted for descriptive convenience.

In the embodiment of FIGS. 11 and 12, the shape of the capping member is partly different from that of the previous embodiment, which will be further described below.

FIG. 11 is a schematic top plan view showing a display device according to an embodiment, and FIG. 12 is a schematic cross-sectional view taken along line XII-XII' of FIG. 11. FIG. 11 and FIG. 12 show the peripheral area of the display device according to an embodiment.

As shown in FIG. 11 and FIG. 12, the display device according to an embodiment may include a power voltage supply line 510 positioned in the peripheral area PA, an encapsulation member 900 overlapping the power voltage supply line 510, and a capping member 530 positioned between the power voltage supply line 510 and the encapsulation member 900.

The capping member 530 may have a rod shape on a plane. In the embodiment of, e.g., FIG. 9, the capping member 530 may have a narrower width than the power voltage supply line 510, and in the embodiment of FIG. 12, the capping member 530 may have a wider width than the power voltage supply line 510. The capping member 530 may extend in a direction parallel to the power voltage supply line 510 and may overlap the power voltage supply line 510. The capping member 530 may overlap the entire power voltage supply line 510. The capping member 530 may cover the entire upper surface of the power voltage supply line 510, and may cover a side and another side of the power voltage supply line 510. For example, the capping member 530 may cover sides (e.g., opposite sides) of the power voltage supply line 510. However, embodiments are not limited thereto, and the capping member 530 may cover the side of the power voltage supply line 510 and may not cover the another side of the power voltage supply line 510.

The display device according to an embodiment will be described with reference to FIG. 13 and FIG. 14, as follows.

Figure 13:
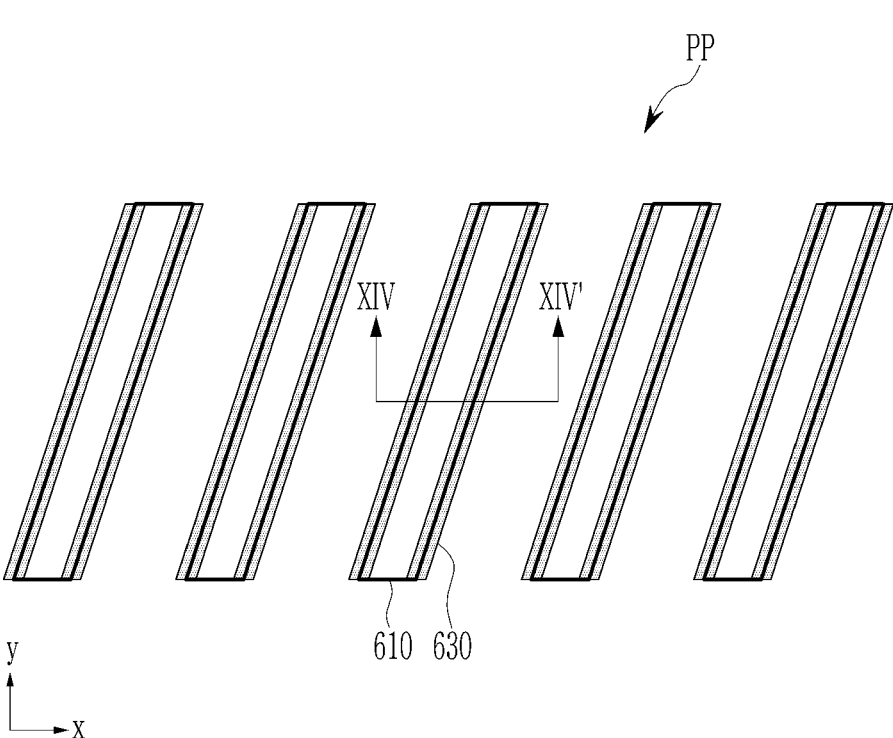
FIG. 13 is a schematic top plan view showing a display device according to an embodiment.
Figure 14:
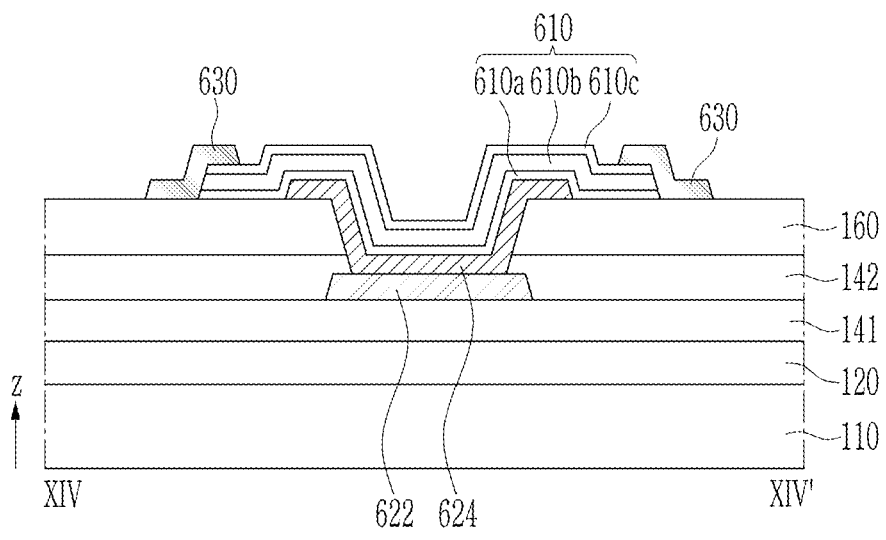
FIG. 14 is a schematic cross-sectional view taken along line XIV-XIV' of FIG. 13.

The display device according to an embodiment of FIG. 13 and FIG. 14 is the same as most of the display device of the embodiment of FIG. 1 to FIG. 7 so that the redundant description for the same parts is omitted for descriptive convenience.

The embodiment of FIGS. 13 and 14 is partly different from the previous embodiment in that a capping member covering at least a part of pad electrodes forming the pad portion is formed, which will be further described below.

FIG. 13 is a schematic top plan view showing a display device according to an embodiment, and FIG. 14 is a schematic cross-sectional view taken along line XIV-XIV' of FIG. 13. FIG. 13 and FIG. 14 show the peripheral area, e.g., a pad portion PP of the display device, according to an embodiment.

As shown in FIG. 13 and FIG. 14, the display device according to an embodiment may include a pad portion PP positioned in the peripheral area PA. The pad portion PP may be positioned adjacent to the lower edge portion of the display device according to an embodiment. However, embodiments are not limited thereto, and the position of the pad portion PP may be variously changed.

The pad portion PP may include pad electrodes 610. Pad electrodes 610 may be spaced apart from each other at a certain interval (or distance) on a plane. Pad electrodes 610 may be disposed in a line along the first direction x. However, embodiments are not limited thereto, and pad electrodes 610 may be arranged side by side in two or more rows.

Each pad electrode 610 may be formed in a polygon shape on a plane. For example, the pad electrode 610 may have a quadrangular shape including two sides extending in the first direction x and two sides extending in a direction oblique to the first direction x. For example, some other pad electrodes 610 may have a shape that is symmetrical to the pad electrodes 610 of FIG. 13 based on an imaginary line extending in the second direction y. However, embodiments are not limited thereto, and each pad electrode 610 may be formed in a quadrangular shape including two sides extending in the first direction x and two sides extending in the second direction y.

The pad electrode 610 may be positioned in the fifth conductive layer. The pad electrode 610 and the connection wiring EW may be positioned on the same layer. As described above, the fifth conductive layer may have a triple layer structure. Accordingly, the pad electrode 610 may include a lower layer 610a, a middle layer 610b, and an upper layer 610c. For example, the lower layer 610a of the pad electrode 610 may include titanium, the middle layer 610b may include aluminum, and the upper layer 610c may include titanium. The middle layer 610b may be positioned on the lower layer 610a of the pad electrode 610, and the upper layer 610c may be positioned on the middle layer 610b. The lower layer 610a, the middle layer 610b, and the upper layer 610c of the pad electrode 610 may have substantially the same width. At end portions (e.g., opposite end portions) of the pad electrode 610, the end portions of the lower layer 610a, the middle layer 610b, and the upper layer 610c may coincide (or may be aligned with each other. For example, some of the lower layer 610a, the middle layer 610b, and the upper layer 610c may not protrude.

The display device according to an embodiment may further include auxiliary electrodes 622 and 624 connected to the pad electrode 610. The auxiliary electrodes 622 and 624 may be positioned in the peripheral area PA and may overlap the pad electrode 610. The auxiliary electrodes 622 and 624 may have a narrower width than the pad electrode 610. However, embodiments are not limited thereto, and the auxiliary electrodes 622 and 624 may have substantially the same width as the pad electrode 610 or may have a wider width.

The auxiliary electrodes 622 and 624 may include a first auxiliary electrode 622 and a second auxiliary electrode 624. The first auxiliary electrode 622 may be positioned in the second conductive layer. The first auxiliary electrode 622 and the gate electrode G1 of the transistor TR may be positioned on the same layer. The second auxiliary electrode 624 may be positioned in the fourth conductive layer. The second auxiliary electrode 624 and the source electrode S1 and the drain electrode D1 of the transistor TR may be positioned on the same layer.

A second insulating layer 142 and a third insulating layer 160 may be positioned between the second conductive layer and the fourth conductive layer. A contact hole overlapping the first auxiliary electrode 622 and the second auxiliary electrode 624 may be formed in the second insulating layer 142 and the third insulating layer 160. The second auxiliary electrode 624 may be connected to the first auxiliary electrode 622 through the contact hole.

A fourth insulating layer 181 may be positioned between the fourth conductive layer and the fifth conductive layer. The fourth insulating layer 181 may not be formed in at least a partial region of the peripheral area PA, and the pad electrode 610 may be connected to the second auxiliary electrode 624 in the corresponding region. For example, the pad electrode 610 may be in contact with the second auxiliary electrode 624. The pad electrode 610 may be positioned (e.g., directly positioned) on the second auxiliary electrode 624. The fourth insulating layer 181 may not be formed on the entire pad portion PP. The pad electrode 610 may be in contact with the upper and side surfaces of the second auxiliary electrode 624.

The pad portion PP may be bonded to the flexible printed circuit unit 20, and pad electrodes 610 included in the pad portion PP may be connected to pads included in the flexible printed circuit unit 20 to receive a certain signal. An anisotropic conductive film may be positioned between the pad portion PP and the flexible printed circuit unit 20. In the process of bonding the flexible printed circuit unit 20 to the pad portion PP, in case that a pressure is applied, and a thick organic layer is positioned on the portion to which the pressure is applied, the bonding between the pad electrode 610 and the pad of the flexible printed circuit unit 20 may not be properly performed. In the display device according to an embodiment, the organic layer may not be positioned in at least a partial region of the peripheral area PA. For example, the organic layer positioned in the region overlapping the pad electrode 610 and adjacent thereto may be removed by patterning. For example, the fourth insulating layer 181, the fifth insulating layer 182, and the pixel definition layer 190 positioned around the pad electrode 610 may be removed. Accordingly, the pad electrode 610 may not overlap the fourth insulating layer 181, the fifth insulating layer 182, and the pixel definition layer 190. The fourth insulating layer 181, the fifth insulating layer 182, and the pixel definition layer 190 may not be formed on the entire pad portion PP.

The display device according to an embodiment may further include a capping member 630 positioned on the pad electrode 610. The capping member 630 may be positioned in the peripheral area PA, and may overlap the pad electrode 610. The capping member 630 may overlap an edge portion of the pad electrode 610, and may extend in a direction parallel to the edge portion. The capping member 630 may overlap another edge portion facing an edge portion of the pad electrode 610 and may extend in a direction parallel to another edge portion. The pad electrode 610 may have a quadrangular shape including two long sides and two short sides on a plane, and the capping member 630 may overlap the two long sides of the pad electrode 610. However, embodiments are not limited thereto, and the positional relationship between the capping member 630 and the pad electrode 610 may be variously changed.

End portions (e.g., opposite end portions) of the pad electrode 610 may be covered by the capping member 630. The upper and side surfaces of end portions (e.g., opposite end portions) of the pad electrode 610 may be covered by the capping member 630. The capping member 630 may be positioned (e.g., directly disposed) on the pad electrode 610. The capping member 630 may be made of a conductive material. For example, the capping member 630 may be formed of a transparent conductive oxide such as indium-tin oxide (ITO) or indium-zinc oxide (IZO), or a metal material such as molybdenum (Mo), aluminum (Al), copper (Cu), silver (Ag), chromium (Cr), tantalum (Ta), titanium (Ti), or the like. The capping member 530 may be formed of multiple layers, and may have, for example, a triple layer structure such as Ti/Al/Ti or ITO/Ag/ITO. In case that the capping member 630 is made of a conductive material, the capping member 630 may function to lower the resistance of the pad electrode 610, and thus may prevent a voltage drop occurred by the pad electrode 610. However, embodiments are not limited thereto, and the capping member 630 may be made of an insulating material. For example, the capping member 630 may be made of an inorganic insulating material such as a silicon nitride ($SiN_x$), a silicon oxide ($SiO_x$), or a silicon oxynitride ($SiO_xN_y$). In case that the capping member 630 is made of an insulating material, the pad electrode 610 may be prevented from being short-circuited with other wiring due to impurities such as conductive particles generated during the process. It is possible to prevent a short circuit between the adjacent pad electrodes 610 from occurring.

As described above, the connection wiring EW positioned in the fifth conductive layer may have a structure in which the end portions of the lower layer EWa and the upper layer EWc are protruded more than the end portion of the middle layer EWb in the part of the connection wiring EW exposed by the opening OP. With this structure, the middle layer EWb of the connection wiring EW may be smoothly connected to the second electrode E2. To form such a structure, the fifth insulating layer 182 may be formed on the fifth conductive layer and patterned to form an opening OP, and the entire surface etching may be performed to etch a portion where the fifth conductive layer is exposed. For example, an etchant capable of selectively etching the middle layer EWb of the connection wiring EW may be used. Accordingly, the middle layer EWb of the connection wiring EW may be etched, and the lower layer EWa and the upper layer EWc may not be etched. At another side end portion of the connection wiring EW exposed by the opening OP after the etching process is performed, at least one end portion of the lower layer EWa, the middle layer EWb, and the upper layer EWc may not coincide (or may not be aligned with each other). The end portion of the middle layer EWb may be positioned more inside than the end portions of the lower layer EWa and the upper layer EWc. For example, the end portions of the lower layer EWa and the upper layer EWc may protrude more than the end portion of the middle layer EWb.

As such, in case that the end portion of the pad electrode 610 is exposed in the process of forming the structure in which some layers of another side end portion of the connection wiring EW are protruded, the end portion of the pad electrode 610 may also have a structure in which some layers of the pad electrode 610 are protruded. The pad electrode 610 may have a structure in which a portion of the pad electrode 610 is not covered by the organic layer, and the end portion of the pad electrode 610 may be continuously exposed during several etching processes in the subsequent process, thereby causing damage. For example, the end portion of the upper layer 610c of the pad electrode 610 may be deformed, such as being broken or lifted. In the display device according to an embodiment, since the end portion of the pad electrode 610 is covered by the capping member 630, the end portion of the pad electrode 610 may not be exposed in the process of forming the structure in which some layers of another side end portion of the connection wiring EW are protruded. Therefore, the end portions of the lower layer 610a, the middle layer 610b, and the upper layer 610c may coincide (or may be aligned with each other) at end portions (e.g., opposite end portions) of the pad electrode 610, and the end portion of the upper layer 610c of the pad electrode 610 may be prevented from having the deformation such as being broken or lifted. Since the end portion of the pad electrode 610 is covered by the capping member 630 in the subsequent process, the damage to the end portion of the pad electrode 610 may be prevented. The capping member 630 may be formed immediately after the process of forming the fifth conductive layer. After the capping member 630 is formed, a process of forming the fifth insulating layer 182 may be performed.

The display device according to an embodiment will be described with reference to FIG. 15, as follows.

Figure 15:
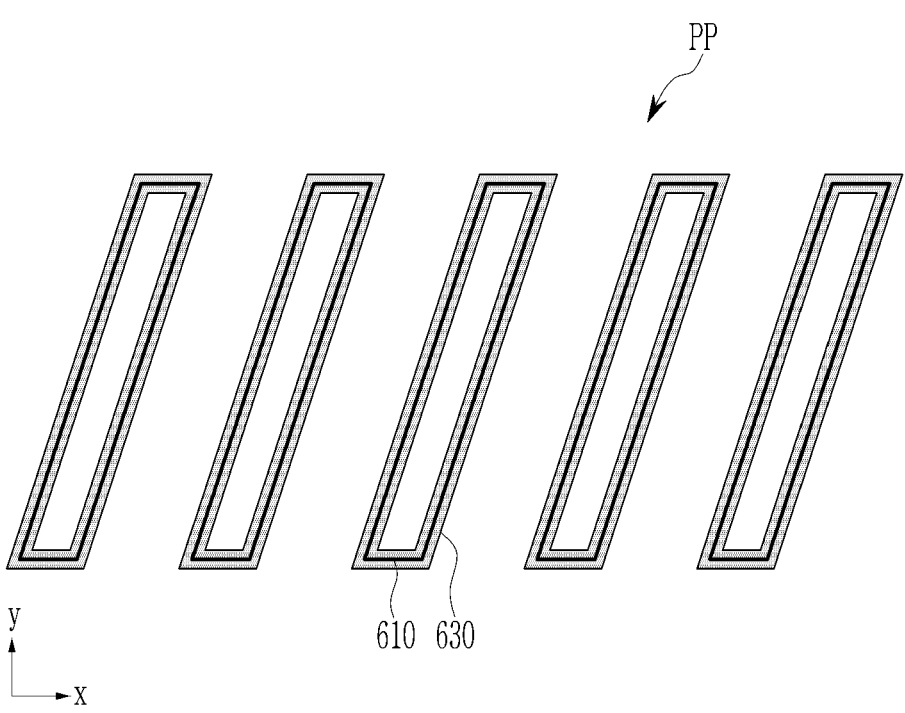
FIG. 15 is a schematic top plan view showing a display device according to an embodiment.

The display device according to the embodiment of FIG. 15 has the same parts as the display device according to the embodiment of FIG. 13 and FIG. 14 so that the redundant description of the same parts is omitted for descriptive convenience. In the embodiment of FIG. 15, the shape of the capping member is partly different from that of the previous embodiment, which will be further described below.

FIG. 15 is a schematic top plan view showing a display device according to an embodiment. FIG. 15 shows a peripheral area, e.g., a pad portion PP of a display device according to an embodiment.

As shown in FIG. 15, the display device according to an embodiment may include a pad portion PP positioned in the peripheral area PA. The pad portion PP may include pad electrodes 610, and a capping member 630 may be positioned on the pad electrodes 610. Pad electrodes 610 may be spaced apart from each other at a certain interval (or distance). Each pad electrode 610 may be formed in a polygon shape on a plane. The pad electrode 610 may be positioned in the fifth conductive layer, and may include a lower layer 610a, a middle layer 610b, and an upper layer 610c. The pad electrode 610 and the connection wiring EW may be positioned on the same layer. An organic layer may not be formed around the pad electrode 610. The end portion of the pad electrode 610 may not be covered by the organic layer, but may be covered by the capping member 630. The upper surface and the side surface of the end portion of the pad electrode 610 may be covered by the capping member 630, and the damage to the pad electrode 610 may be prevented during the process. The capping member 630 may be made of a conductive material, and may function to lower the resistance of the pad electrode 610 by being connected to the pad electrode 610. However, embodiments are not limited thereto, and the capping member 630 may be made of an inorganic insulating material.

In the embodiment of, e.g., FIG. 13, the capping member 630 may overlap two facing edge portions of the pad electrode 610, and in the embodiment of FIG. 15, the capping member 630 may overlap all edge portions of the pad electrode 610. The capping member 630 may have a loop shape surrounding the center portion of the pad electrode 610 on a plane. The pad electrode 610 may have a quadrangular shape including two long sides and two short sides on a plane, and the capping member 630 may overlap four sides of the pad electrode 610. However, embodiments are not limited thereto, and the positional relationship between the capping member 630 and the pad electrode 610 may be variously changed.

The display device according to an embodiment will be described with reference to FIG. 16 and FIG. 17, as follows.

Figure 16:
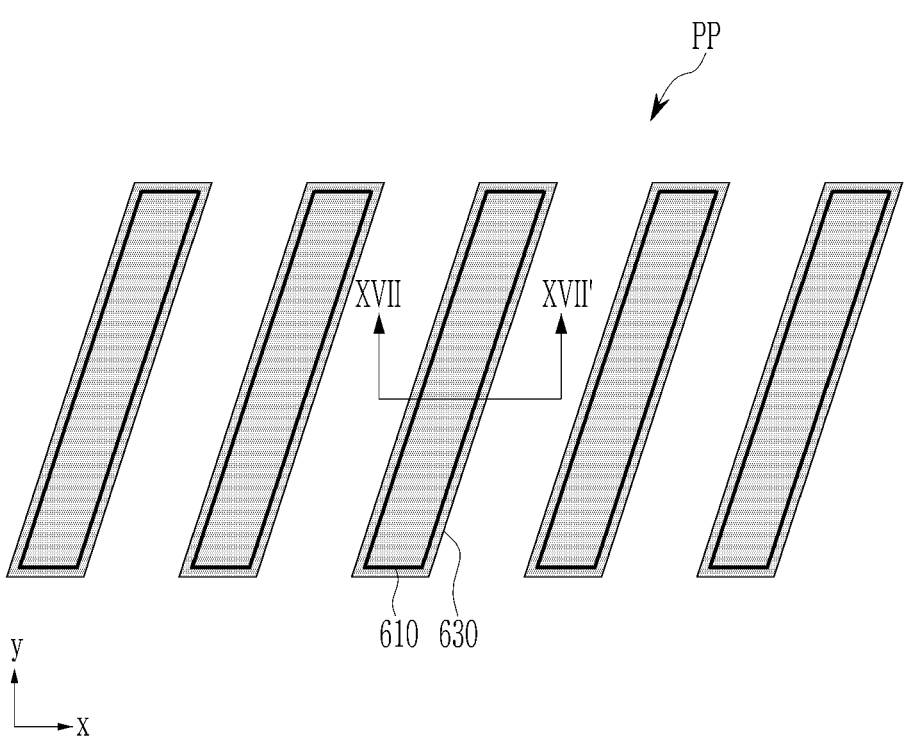
FIG. 16 is a schematic top plan view showing a display device according to an embodiment.
Figure 17:
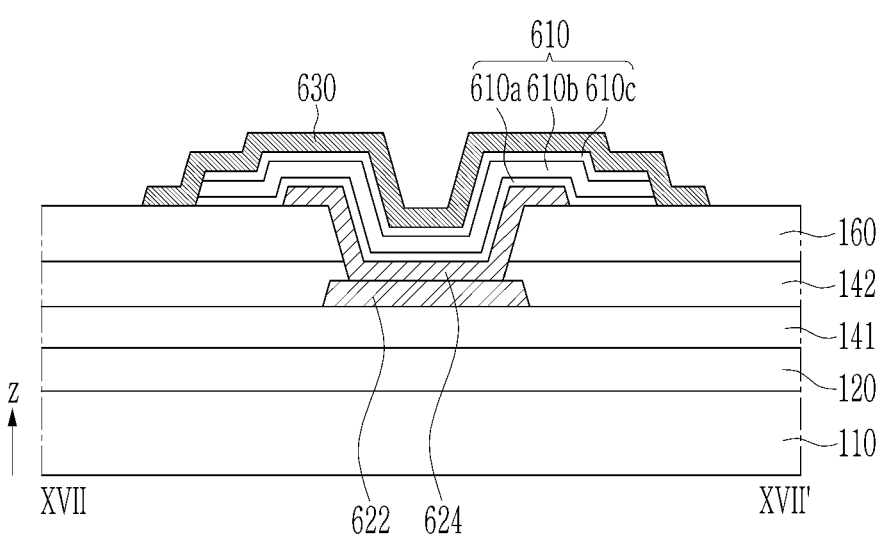
FIG. 17 is a schematic cross-sectional view taken along line XVII-XVII' of FIG. 16.

The display device according to the embodiment of FIG. 16 and FIG. 17 has the same parts as the display device according to the embodiment of FIG. 13 and FIG. 14, so the redundant description of the same parts is omitted for descriptive convenience. In the embodiment of FIGS. 16 and 17, the shape of the capping member is partly different from that of the previous embodiment, which will be further described below.

FIG. 16 is a schematic top plan view showing a display device according to an embodiment, and FIG. 17 is a schematic cross-sectional view taken along line XVII-XVII' of FIG. 16. FIG. 16 and FIG. 17 show a peripheral area, e.g., a pad portion PP of a display device according to an embodiment.

As shown in FIG. 16 and FIG. 17, the display device according to an embodiment may include a pad portion PP positioned in the peripheral area PA. The pad portion PP may include pad electrodes 610, and a capping member 630 may be positioned on the pad electrode 610. Pad electrodes 610 may be spaced apart from each other at a certain interval (or distance).

In the previous embodiment, the capping member 630 may overlap a portion of the pad electrode 610, and in the embodiment of FIGS. 16 and 17, the capping member 630 may overlap the entire pad electrode 610. The capping member 630 may have a planar shape similar to that of the pad electrode 610, and may be larger than the pad electrode 610. The capping member 630 may be formed in a quadrangular shape including four sides parallel to each side of the pad electrode 610. The capping member 630 may have a wider width than the pad electrode 610. The capping member 630 may cover the entire upper surface of the pad electrode 610 and may cover the entire side surface of the pad electrode 610. However, embodiments are not limited thereto, and the shape of the capping member 630 may be variously changed.

As described above in several embodiments, the display device according to an embodiment may include the conductive pattern layer such as the power voltage supply line, the pad electrode, etc. positioned in the peripheral area. This conductive pattern layer may be positioned on the same layer as some constituent elements positioned in the display area, for example, the connection wiring positioned in the fifth conductive layer. A part of the connection wiring may be covered by the organic insulating layer, and another part of the connection wiring may not be covered by the organic insulating layer, and some layers of layers forming the connection wiring may have the protruded shape. The part of the conductive pattern layer may not be covered by the organic insulating layer, but may be covered by the capping member. Therefore, the conductive pattern layer may be protected by the capping member during the process, and defects caused by the damage to the conductive pattern layer may be prevented.

As described above, the number of the transistors and the capacitors included in the pixel driving circuit unit of the display device according to an embodiment may be variously changed. Hereinafter, an example of a pixel driving circuit unit of a display device according to an embodiment will be described with reference to FIG. 18.

Figure 18:
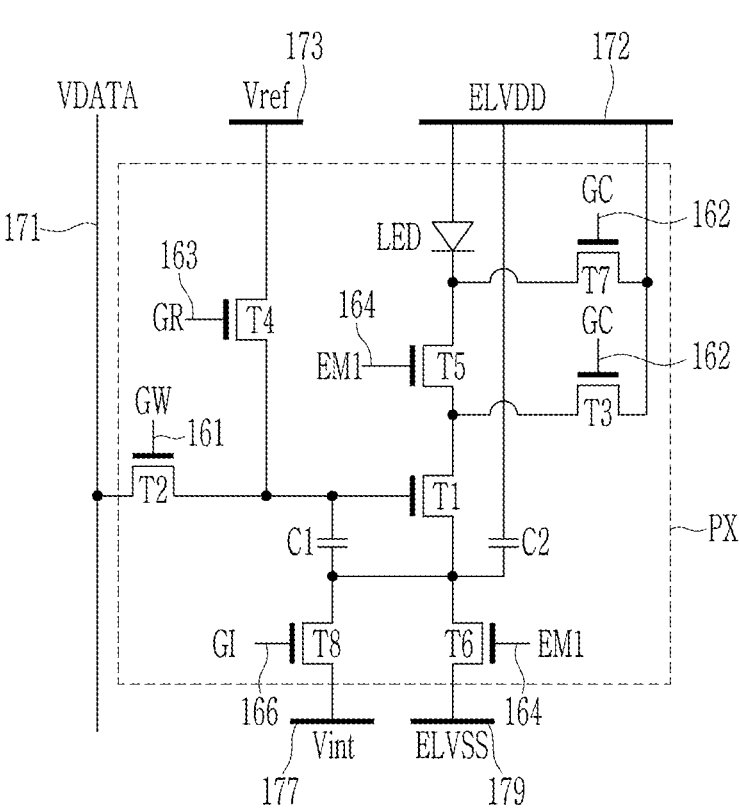
FIG. 18 is a schematic diagram of an equivalent circuit of a representative pixel of a display device according to an embodiment.

FIG. 18 is a schematic diagram of an equivalent circuit of a representative pixel of a display device according to an embodiment.

Referring to FIG. 18, the display device according to an embodiment may include pixels PX, and each of pixels PX may include a light-emitting element LED and a pixel driving circuit unit connected thereto. The pixel driving circuit unit may include a first transistor T1, a second transistor T2, a third transistor T3, a fourth transistor T4, a fifth transistor T5, a sixth transistor T6, a seventh transistor T7, an eighth transistor T8, a first capacitor C1, and a second capacitor C2.

For example, the pixel driving circuit unit may be connected to a first scan line 161 to which a first scan signal GW is applied, a second scan line 162 to which a second scan signal GC is applied, a third scan line 163 to which a third scan signal GR is applied, a fourth scan line 166 to which a fourth scan signal GI is applied, a first light emission signal line 164 to which a first light emission signal EM1 is applied, and a data line 171 to which a data voltage VDATA is applied. For example, the pixel PX may be connected to a first power voltage line 172 to which a first power voltage ELVDD is applied, a second power voltage line 179 to which a second power voltage ELVSS is applied, a reference voltage line 173 to which a reference voltage Vref is applied, and an initialization voltage line 177 to which an initialization voltage Vint is applied.

The circuit structure of the pixel PX, regarding each element (e.g., the transistor, the capacitor, the light-emitting element) included in the pixel PX, is described as follows.

The first transistor T1 (hereinafter, also referred to as a driving transistor) may include a gate electrode connected to a first electrode of the first capacitor C1, a second electrode of the second transistor T2, and a second electrode of the fourth transistor T4, a first electrode (e.g., an input side electrode) connected to a second electrode of the third transistor T3 and a second electrode of the fifth transistor T5, and a second electrode (e.g., an output side electrode) connected to a first electrode of the sixth transistor T6, a second electrode of the eighth transistor T8, a second electrode of the first capacitor C1, and a second electrode of the second capacitor C2.

In the first transistor T1, the turn-on state of the first transistor T1 may be determined according to the voltage of the gate electrode, and the magnitude of the current flowing from the first electrode to the second electrode of the first transistor T1 may be determined according to the turn-on state of the first transistor T1. The current flowing from the first electrode to the second electrode of the first transistor T1 may be the same as the current flowing through the light-emitting element LED in the light emission period, so it may also be referred to as a light emission current. For example, the first transistor T1 may be formed as an n-type transistor, and as the voltage of the gate electrode increases, the large light emission current may flow. In case that the light emission current is large, the light-emitting element LED may display high luminance.

The second transistor T2 (hereinafter, also referred to as a data input transistor) may include a gate electrode connected to a first scan line 161 to which the first scan signal GW is applied, a first electrode (e.g., an input side electrode) connected to a data line 171 to which a data voltage VDATA is applied, and a second electrode (e.g., an output side electrode) connected to the first electrode of the first capacitor C1, the gate electrode of the first transistor T1, and the second electrode of the fourth transistor T4. The second transistor T2 may input the data voltage VDATA into the pixel PX according to the first scan signal GW to be transmitted to the gate electrode of the first transistor T1 and stored in the first electrode of the first capacitor C1.

The third transistor T3 (hereinafter, also referred to as first voltage transmitting transistor) may include a gate electrode connected to a second scan line 162 to which the second scan signal GC is applied, a first electrode (e.g., an input side electrode) connected to the first power voltage line 172, and a second electrode (e.g., an output side electrode) connected to the first electrode of the first transistor T1 and the second electrode of the fifth transistor T5. The third transistor T3 may transfer the first power voltage ELVDD to the first transistor T1 such that a current may not flow through the light-emitting element LED. A problem that the light-emitting element LED unnecessarily emits light may be prevented by transferring the first power voltage ELVDD to the first transistor T1 through a separate path. Therefore, the third transistor T3 may not be turned on in the light emission period, and may be turned on in other periods.

The fourth transistor T4 (hereinafter, also referred to as a reference voltage transmitting transistor) may include a gate electrode connected to a third scan line 163 to which the third scan signal GR is applied, a first electrode connected to the reference voltage line 173, and a second electrode connected to the first electrode of the first capacitor C1, the gate electrode of the first transistor T1, and the second electrode of the second transistor T2. The fourth transistor T4 may function to initialize by transferring the reference voltage Vref to the first electrode of the first capacitor C1 and the gate electrode of the first transistor T1.

The fifth transistor T5 (hereafter, also referred to as a cathode connection transistor) may include a gate electrode connected to a first light emission signal line 164 to which the first light emission signal EM1 is applied, a first electrode connected to the cathode of the light-emitting element LED and the first electrode of the seventh transistor T7, and a second electrode connected to the first electrode of the first transistor T1 and the second electrode of the third transistor T3. The fifth transistor T5 may connect the first electrode of the first transistor T1 and the light-emitting element LED based on the first light emission signal EM1 to form a current path such that the light-emitting element LED may emit light.

The sixth transistor T6 (hereinafter, also referred to as a driving low voltage application transistor) may include a gate electrode connected to a first light emission signal line 164 to which the first light emission signal EM1 is applied, a first electrode connected to the second electrode of the first transistor T1, the second electrode of the first capacitor C1, the second electrode of the second capacitor C2, and the second electrode of the eighth transistor T8, and a second electrode for receiving the second power voltage ELVSS. The sixth transistor T6 may transmit or may block the second power voltage ELVSS to the second electrode of the first transistor T1 based on the first light emission signal EM1.

The seventh transistor T7 (hereinafter, also referred to as a second voltage transmitting transistor) may include a gate electrode connected to a second scan line 162 to which the second scan signal GC is applied, a first electrode (e.g., an input side electrode) connected to the first power voltage line 172, and a second electrode (e.g., an output side electrode) connected to the first electrode of the fifth transistor T5 and the cathode of the light-emitting element LED. The seventh transistor T7 may function a role in transferring the first power voltage ELVDD to the cathode, and by changing the voltage of the cathode to the first power voltage ELVDD, the problem of not being able to display a black due to the remaining charge on the cathode may be prevented or eliminated such that a black image may be clearly displayed.

The eighth transistor T8 (hereinafter, also referred to as an initialization voltage transmitting transistor) may include a gate electrode connected to a fourth scan line 166 to which the fourth scan signal GI is applied, a first electrode (e.g., an input side electrode) connected to the initialization voltage line 177, and a second electrode (e.g., an output side electrode) connected to the second electrode of the first transistor T1, the first electrode of the sixth transistor T6, the second electrode of the first capacitor C1, and the second electrode of the second capacitor C2. The eighth transistor T8 function to transfer the initialization voltage Vint to the second electrode of the first transistor T1, the first electrode of the sixth transistor T6, the second electrode of the first capacitor C1, and the second electrode of the second capacitor C2 to be initialized.

In the embodiment of FIG. 18, all transistors may be formed as n-type transistors, and each transistor may be turned on in case that the voltage of the gate electrode is a high level voltage and may be turned off in case that the voltage of the gate electrode is a low level voltage. For example, the semiconductor layer included in each transistor may use a polysilicon semiconductor or an oxide semiconductor, and additionally an amorphous silicon semiconductor or a single crystal silicon semiconductor may be used.

According to an embodiment, the semiconductor layer included in each transistor may further include an overlapping layer (e.g., an additional gate electrode) overlapping it, and the characteristic of the transistor may be changed to improve the display quality of the pixel by applying a voltage to the overlapping layer (e.g., the additional gate electrode).

The first capacitor C1 may include a first electrode connected to the gate electrode of the first transistor T1, the second electrode of the second transistor T2, and the second electrode of the fourth transistor T4, and a second electrode connected to the second electrode of the first transistor T1, the first electrode of the sixth transistor T6, the second electrode of the eighth transistor T8, and the second electrode of the second capacitor C2. The first electrode of the first capacitor C1 may function to receive and store the data voltage VDATA from the second transistor T2.

The second capacitor C2 may include a first electrode connected to the first power voltage line 172, and a second electrode connected to the second electrode of the first transistor T1, the first electrode of the sixth transistor T6, the second electrode of the eighth transistor T8, and the second electrode of the first capacitor C1. The second capacitor C2 may function to maintain the voltage of the second electrode of the first transistor T1 and the second electrode of the first capacitor C1 to be substantially constant. In another example, the second capacitor C2 may be omitted.

The light-emitting element LED may include the anode connected to the first power voltage line 172 to receive the first power voltage ELVDD and the cathode connected to the first electrode of the fifth transistor T5 and the second electrode of the seventh transistor T7. The cathode of the light-emitting element LED may be connected to the first transistor T1 through the fifth transistor T5. The light-emitting element LED may be positioned between the pixel driving circuit unit and the first power voltage line 172 so that the same current as the current flowing through the first transistor T1 of the pixel driving circuit unit may flow, and the luminance of light to be emitted may be determined according to the magnitude (or amount) of the current. The light-emitting element LED may include an emission layer including at least one of an organic light emission material and an inorganic light emission material between the anode and the cathode of the light-emitting element LED.

The pixel PX according to the embodiment of FIG. 18 may perform a compensation operation for detecting the change in the characteristic (e.g., the threshold voltage) of the first transistor T1 to display a substantially constant display luminance regardless of the change in the characteristic (e.g., the threshold voltage) of the first transistor T1.

In FIG. 18, the light-emitting element LED may be positioned between the first electrode of the first transistor T1 and the first power voltage line 172. The pixel PX according to the embodiment may be distinguished from a pixel in which the light-emitting element is positioned between the first transistor and the second power voltage line. The light-emitting element LED may display the luminance according to the magnitude of the current flowing through the current path from the first power voltage line 172 through the first transistor T1 to the second power voltage line 179. For example, as the current is increased, the displayed luminance may be increased. In the pixel structure of FIG. 18, since the first electrode of the first transistor T1 and the light-emitting element LED are connected and separated from the second electrode (e.g., the source electrode) of the first transistor T1, it is possible to have a merit that there is no change in the voltage of the second electrode (e.g., the source electrode) of the first transistor T1 in case that the voltage of each part of the pixel driving circuit unit changes. For example, in case that the sixth transistor T6 is turned on, the voltage of the second electrode of the first capacitor C1 may be lowered and the voltage of the first electrode of the first capacitor C1 may be also lowered, and due to this, the output current output by the first transistor T1 may also be lowered, but in the embodiment, the problem that the output current of the first transistor T1 is lowered may be prevented or eliminated.

In the embodiment of FIG. 18, a single pixel PX was described as including eight transistors (e.g., transistors T1 to T8) and two capacitors (e.g., the first capacitor C1 and the second capacitor C2), but embodiments are not limited thereto, and a capacitor or a transistor may be additionally included, and some capacitors or transistors may be omitted.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a substrate;
a transistor disposed on the substrate;
a first electrode disposed on the substrate;
a pixel definition layer disposed on the first electrode;
a separator pattern layer disposed on the pixel definition layer;
a second electrode disposed on the first electrode, the pixel definition layer, and the separator pattern layer;
a connection layer connected between the transistor and the second electrode;
an emission layer disposed between the first electrode and the second electrode;
a conductive pattern layer; and
a capping member covering a side end portion of the conductive pattern layer, wherein
the conductive pattern layer and the connection layer are disposed on a same layer, and
a part of the second electrode disposed on the separator pattern layer and a part of the second electrode disposed around the separator pattern layer are separated from each other.

2. The display device of claim 1, wherein
the display device includes:
a display area that displays an image; and
a peripheral area surrounding the display area, and
the conductive pattern layer and the capping member are disposed in the peripheral area.

3. The display device of claim 2, wherein
the conductive pattern layer is configured to transmit a substantially constant voltage, and has a planar shape surrounding the display area.

4. The display device of claim 3, wherein
the conductive pattern layer is connected to the first electrode and is configured to transmit a high potential power voltage.

5. The display device of claim 3, further comprising:
an opposing substrate facing the substrate; and
an encapsulation member disposed between the substrate and the opposing substrate,
wherein the encapsulation member overlaps the side end portion of the conductive pattern layer.

6. The display device of claim 5, wherein
each of the connection layer and the conductive pattern layer is formed of a triple layer including a lower layer, an upper layer, and a middle layer between the lower layer and the upper layer,
at a side end portion of the connection layer, the lower layer and the upper layer of the connection layer are protruded more than the middle layer of the connection layer, and
at the side end portion of the conductive pattern layer, the lower layer, the middle layer, and the upper layer of the conductive pattern layer are aligned with each other.

7. The display device of claim 6, wherein
the lower layer and the upper layer of each of the connection layer and the conductive pattern layer include titanium, and
the middle layer of each of the connection layer and the conductive pattern layer includes aluminum.

8. The display device of claim 6, further comprising:
an organic insulating layer covering another side end portion of the connection layer and another side end portion of the conductive pattern layer,
wherein the side end portion of the connection layer and the side end portion of the conductive pattern layer are not covered by the organic insulating layer.

9. The display device of claim 8, wherein
the capping member covers a side surface and an upper surface of the side end portion of the conductive pattern layer.

10. The display device of claim 3, wherein
the capping member has a rod shape extending along the conductive pattern layer in a plan view.

11. The display device of claim 3, wherein
the capping member has a net shape including a first portion extending along the conductive pattern layer and a second portion extending to cross the first portion in a plan view.

12. The display device of claim 3, wherein
the capping member entirely overlaps the conductive pattern layer.

13. The display device of claim 2, further comprising:
a pad portion disposed in the peripheral area and including the conductive pattern layer.

14. The display device of claim 13, wherein
the pad portion includes a plurality of conductive pattern layers, and
the plurality of conductive pattern layers are disposed to be spaced apart from each other.

15. The display device of claim 13, wherein
each of the connection layer and the conductive pattern layer is formed of a triple layer including a lower layer, an upper layer, and a middle layer between the lower layer and the upper layer, at a side end portion of the connection layer, the lower layer and the upper layer of the connection layer are protruded more than the middle layer of the connection layer, and at the side end portion of the conductive pattern layer, the lower layer, the middle layer, and the upper layer of the conductive pattern layer are aligned with each other.

16. The display device of claim 15, further comprising:

an organic insulating layer covering another side end portion of the connection layer, wherein the conductive pattern layer is not covered by the organic insulating layer.

17. The display device of claim 16, wherein the capping member covers a side surface and a top surface of the side end portion of the conductive pattern layer.

18. The display device of claim 13, wherein the capping member overlaps opposite edge portions of the conductive pattern layer.

19. The display device of claim 13, wherein the capping member entirely overlaps edge portions of the conductive pattern layer.

20. The display device of claim 13, wherein the capping member entirely overlaps the conductive pattern layer.

21. The display device of claim 1, wherein the capping member includes a conductive material.

\* \* \* \* \*